United States Patent
Miyajima

[19]
[11] Patent Number: 5,917,579
[45] Date of Patent: Jun. 29, 1999

[54] BLOCK EXPOSURE OF SEMICONDUCTOR WAFER

[75] Inventor: Masaaki Miyajima, Kasugai, Japan

[73] Assignee: Fujitsu Limited, Kawasaki, Japan

[21] Appl. No.: 08/893,547

[22] Filed: Jul. 8, 1997

[30] Foreign Application Priority Data

Oct. 31, 1996 [JP] Japan .................................. 8-289851

[51] Int. Cl.$^6$ .......................... G03B 27/42; H01J 37/304
[52] U.S. Cl. ............................ 355/53; 250/492.23; 430/5
[58] Field of Search .......................... 355/53; 250/492.2, 250/492.21, 492.22, 492.23; 430/5; 356/399, 400, 401

[56] References Cited

U.S. PATENT DOCUMENTS

| 5,256,881 | 10/1993 | Yamazaki et al. | 250/492.23 |
| 5,438,207 | 8/1995 | Itoh et al. | 250/492.23 |
| 5,439,764 | 8/1995 | Alter et al. | 430/5 |
| 5,557,110 | 9/1996 | Itoh | 250/492.23 |
| 5,604,059 | 2/1997 | Imura et al. | 430/5 |

*Primary Examiner*—Alan A. Mathews
*Attorney, Agent, or Firm*—Staas & Halsey

[57] ABSTRACT

A mask and a block exposure method for transferring a plurality of patterns of the same shape onto an exposure medium while forming the cross-sectional shape of a beam emitted from a light source into a desired pattern. The mask has at least one basic pattern formed by extracting portions of a common shape from pattern information to be exposed. A plurality of blocks are arranged on the mask. Each block includes a plurality of the basic patterns.

9 Claims, 16 Drawing Sheets

BLOCK EXPOSURE OF SEMICONDUCTOR WAFER

BACKGROUND OF THE INVENTION

The present invention relates to an exposure method for semiconductor wafers, and, more particularly, to block exposure. This invention also relates to a mask for exposure, a block exposure method, an exposure data generating method, a mask preparing data generation method and a storage medium.

As recent LSI technology seeks out larger scale integration and further miniaturization, exposure techniques for improving the speed and precision of exposing an LSI pattern are needed. Block exposure is one known exposure technique.

In a block exposure, some common portions in an LSI pattern are extracted as a block and are formed on a stencil mask or a block mask, and the cross-sectional shape of a beam is formed (shaped) by the block based on the patterns of the common portions. This scheme permits a plurality of patterns to be exposed in a single shot, which shortens the exposure time and thus shortens the time of processing a wafer.

Each stencil mask deteriorates as the number of shots increases. In accordance with the deterioration, replacement of degraded stencil masks becomes necessary. Such work prolongs the processing of wafers. To avoid this problem, an improvement in the durability of stencil masks is needed.

FIG. 1 presents a schematic diagram of an electron beam exposure apparatus that performs block exposure. The exposure apparatus 10 has a plate 11 and a stencil mask 13. A rectangular window 12 having a predetermined area is formed in the plate 11. As shown in FIG. 2, the stencil mask 13 has a plurality of block areas 14 and rectangular windows 15 formed.

A block pattern, including some common portions in the layout pattern of a semiconductor device, is formed in each block area 14. Each block pattern includes plural types of patterns and is mounted on the associated block area 14, which is why such a block pattern is called a "mounting block".

A first electromagnetic deflector 17 of the exposure apparatus 10 deflects an electronic beam, which is emitted from a beam source 16 and passes through the rectangular window 12 in the plate 11, so that the beam is selectively irradiated on one block area 14 on the stencil mask 13. A second electromagnetic deflector 18 of the exposure apparatus 10 deflects a formed beam, which has passed through a block area 14 on the stencil mask 13, to expose the extracted layout pattern on a wafer 19.

Since a plurality of patterns are formed in each block area 14, a plurality of patterns can be exposed at a time by a single shot of a beam. Therefore, the exposure time is shortened by mounting preferentially those block patterns on the stencil mask that are likely to be frequently transferred on the wafer 19.

Since a plurality of layout patterns are exposed on the wafer 19 by a beam, which has passed through a single block area 14, layout patterns of the same shape can be formed on the wafer 19 with a high precision. Those features therefore contribute to shortening the exposure time per wafer.

Mounted on the stencil mask 13 used for the exposure of a semiconductor device like a DRAM are a block of layout patterns that are repeatedly used, like those for memory cells, and a block of layout patterns that are less likely to be repeatedly used, like those for input/output circuits. In exposing one chip of a semiconductor device, the number of times a block extracted from memory cells is used, i.e., the number of transfers of the block, is several hundred to several thousand times that of blocks extracted from patterns other than memory cells.

Since a plurality of chips are generally formed on a single wafer 19, the number of transfers of a block extracted from memory cells per wafer is equal to the number of transfers per chip multiplied by the number of chips to be formed. The transfer number of a memory cell block therefore is considerably greater than that of other types of blocks.

In exposing the wafer 19 using the stencil mask 13, an impurity like carbon may adhere to the stencil mask 13. Carbon is included in a resist coating on the wafer 19. When the resist coating is heated by the electron beam, the carbon is scattered and may stick to the stencil mask 13.

The adhered impurity reduces the transmittance of the beam passing through the block. The greater the number of transfers of a block becomes, the lower the transmittance through the block becomes. This may result in insufficient exposure of a layout pattern or may blur the edge of a layout pattern.

The stencil mask 13 is heated by beam irradiation, and the amount of heat increases as the number of beam irradiations or the number of transfers of a block increases. Further, the heat makes the breakage of block patterns from the stencil mask 13 easier.

As apparent from the above, repeatedly used blocks suffer a lower transmittance and a higher defect rate than blocks used fewer times. The greater the number of transfers of a block is, therefore, the shorter the remaining life of the stencil mask 13 and the lower the durability of the stencil mask 13 becomes.

The durability of the stencil mask 13 influences the fabrication time for a semiconductor device. Some blocks are degraded considerably from repetitive usage, while other blocks are still sufficiently usable, which causes frequent stopping of exposure for replacement of the stencil mask 13 or frequent position adjustment of the stencil mask after replacement. This reduces the number of wafers exposed over a given period of time and lengthens the processing time for each wafer 19. This leads to an increased processing cost of semiconductor integrated circuit devices.

SUMMARY OF THE INVENTION

The present invention has been accomplished in order to solve the problems described above, and it is an objective of the present invention to provide a more durable exposure mask.

It is another objective of the invention to provide a method of generating exposure data necessary for a highly durable mask.

An exposure mask according to the invention is for transferring a plurality of patterns of the same shape onto an exposure medium while forming the cross-sectional shape of a beam emitted from a light source into a desired pattern. The exposure mask has at least one basic pattern formed by extracting portions of a common shape from pattern information to be exposed. A plurality of blocks are arranged on the mask. Each block has a plurality of basic patterns of a same shape.

One aspect of the invention is concerned with a method of generating exposure data. According to this method, at the time of transferring pattern information to an exposure medium, a beam emitted from a light source and having a predetermined cross-sectional shape is irradiated on a mask, which carries a plurality of blocks, each of which contains predetermined pattern information, while being deflected. The pattern information is transferred on the exposure medium by the beam, which has passed through each block, while the beam is deflected. Necessary exposure data is generated by sequentially executing the following steps of:

extracting common portions constituting a basic pattern from the pattern information to generate basic pattern information corresponding to that basic pattern, and generating plural pieces of layout data indicating coordinates of the basic pattern on the exposure medium;

copying the basic pattern information in accordance with a predetermined condition to generate plural pieces of copy pattern information, a sum of original basic pattern information and copy pattern information being called sum pattern information;

mounting the sum pattern information on the plurality of blocks;

distributing the plural pieces of layout data to the sum pattern information;

selecting one block from the plurality of blocks and generating primary deflection data for deflecting the beam based on the basic pattern information and the layout data in order to irradiate the beam on the selected block; and generating secondary deflection data for further deflecting the beam that has passed through the selected block based on the basic pattern information and the layout data in order to irradiate the beam on the exposure medium.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

Figure 3:
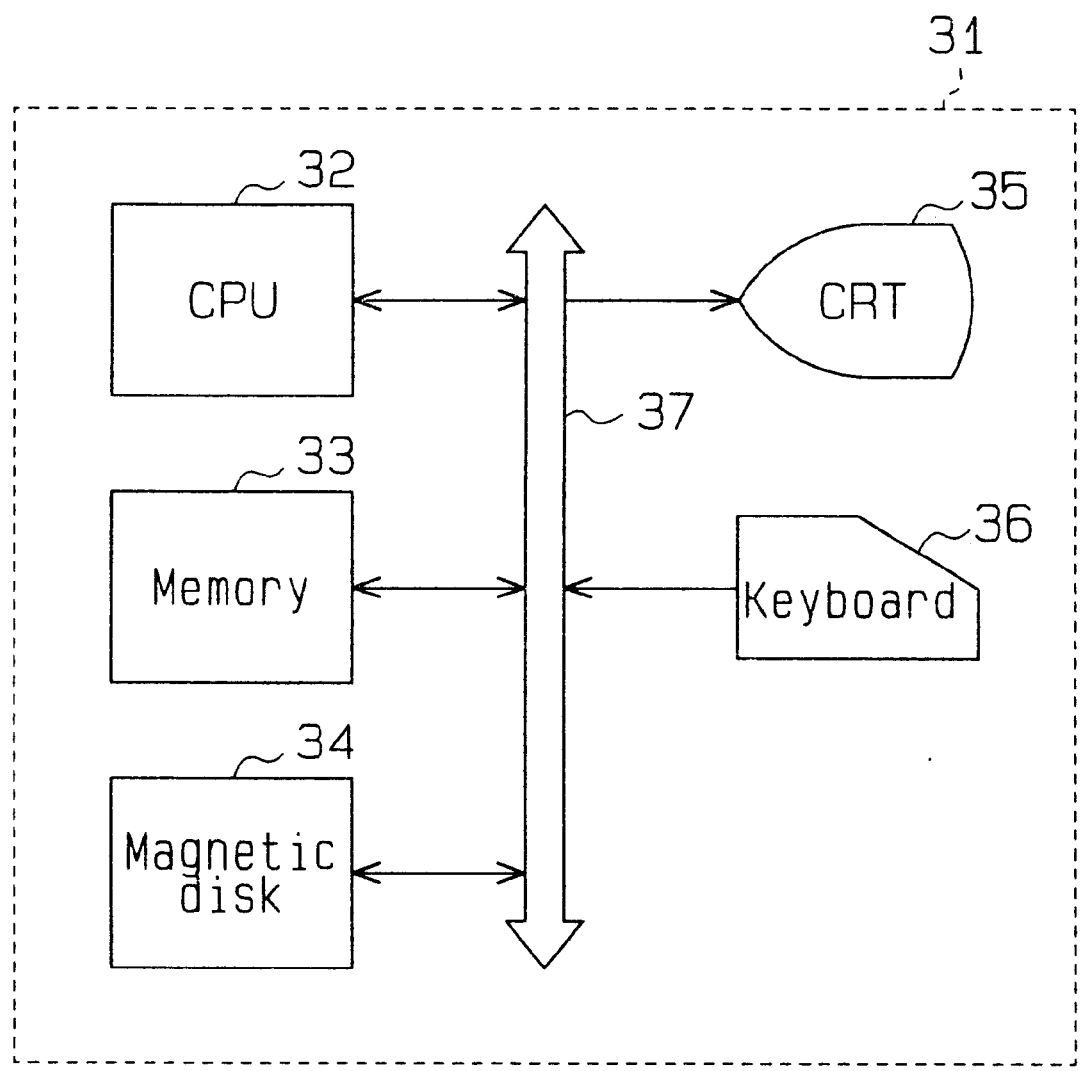
FIG. 3 is a block diagram schematically showing an exposure data generating apparatus according to the first embodiment of the invention.

The first embodiment of the present invention will now be described with reference to FIGS. 3 through 10. FIG. 3 shows the system of an exposure data generating apparatus to which the invention is adapted. The exposure data generating apparatus 31 comprises a central processing unit (CPU) 32, a memory 33, a magnetic disk 34, a display unit 35 and a keyboard 36, which are mutually connected by a bus 37.

Figure 4:
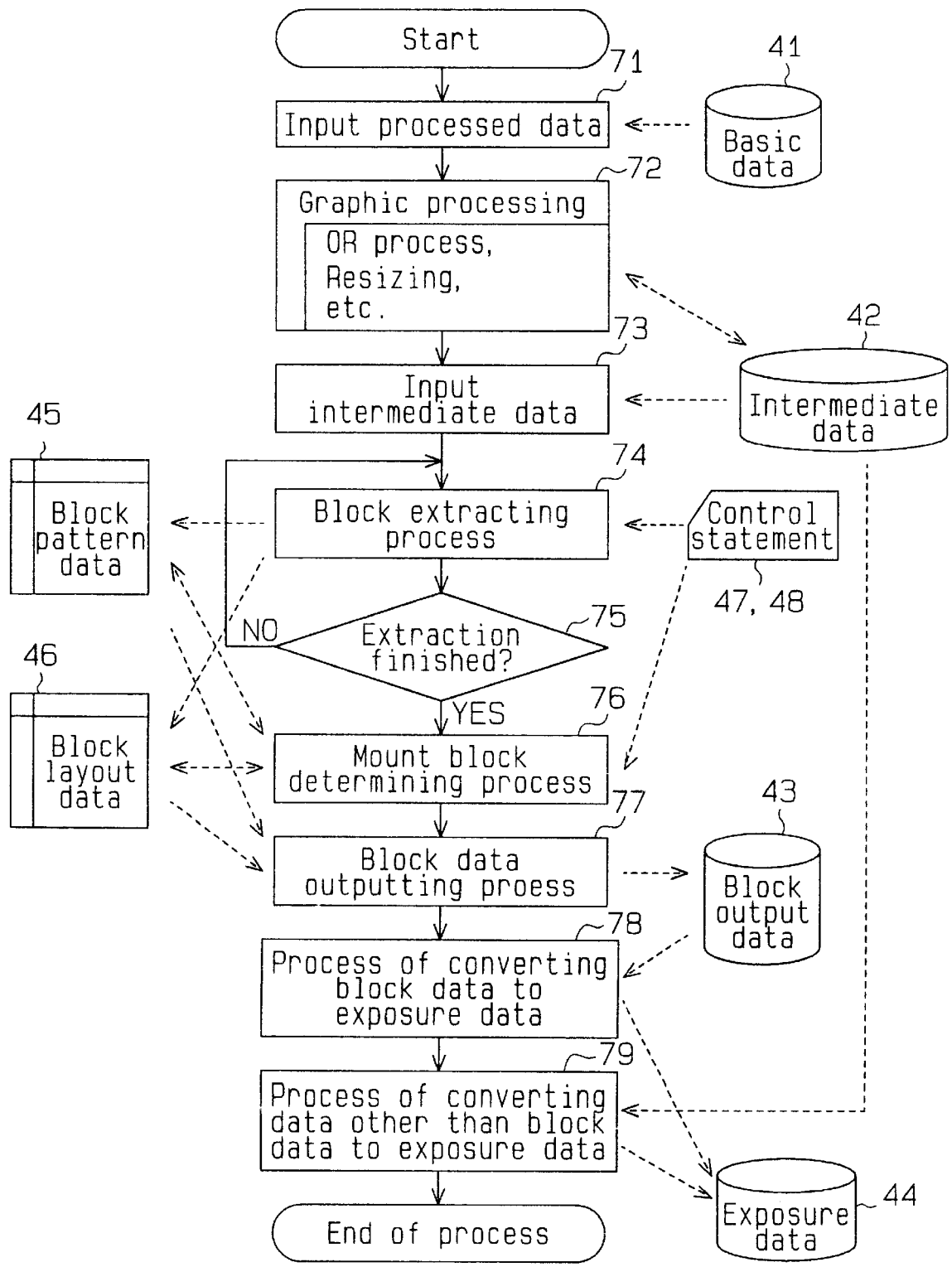
FIG. 4 is a flowchart for an exposure data generating process.
Figure 5:
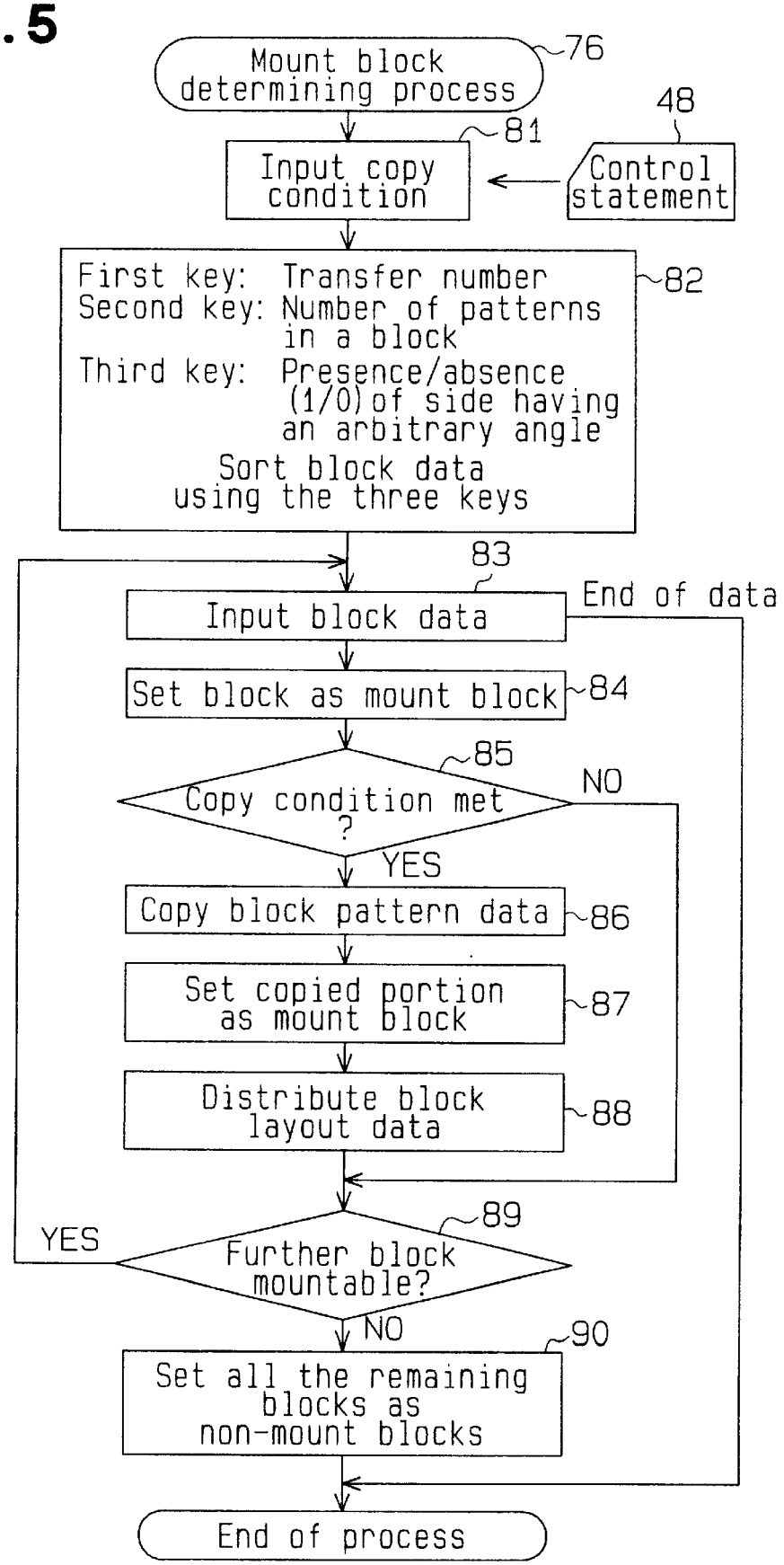
FIG. 5 is a flowchart for a mounting block determining process according to the first embodiment.

Previously stored on the magnetic disk 34 is program data for an exposure data generating process illustrated in FIGS. 4 and 5. The CPU 32 in FIG. 3 executes the exposure data generating process in accordance with steps described in FIGS. 4 and 5.

Also stored on the magnetic disk 34 is a first data file 41 shown in FIG. 4. The first data file 41 holds layout data of a semiconductor (LSI) chip, like a memory, the circuit design and layout design of which have previously been made by a CAD (Computer Aided Design) apparatus (not shown). The CPU 32 in FIG. 3 receives layout data (basic data) from the first data file 41 and performs the exposure data generating process based on the basic data.

In the exposure data generating process, the CPU 32 in FIG. 3 generates second, third and fourth data files 42, 43 and 44 shown in FIG. 4 and stores them on the magnetic disk 34 in FIG. 3. The CPU 32 reads pattern information or basic data from the first data file 41 in FIG. 4, and performs predetermined graphic processing on the basic data. The CPU 32 stores the basic data after the graphic processing as intermediate data in the second data file 42.

The second, third and fourth data files 42, 43 and 44 in FIG. 4 are stored on the magnetic disk 34 in FIG. 3. Fifth and sixth data files 45 and 46 shown in FIG. 4 are stored in the memory 33 in FIG. 3. The CPU 32 temporarily stores the basic data after graphic processing as intermediate data in the second data file 42 in FIG. 4.

Next, the CPU 32 in FIG. 3 acquires the intermediate data stored in the second data file 42, extracts common portions as blocks from the intermediate data, and stores block data as the extraction result in the fifth and sixth data files 45 and 46.

Figure 6:
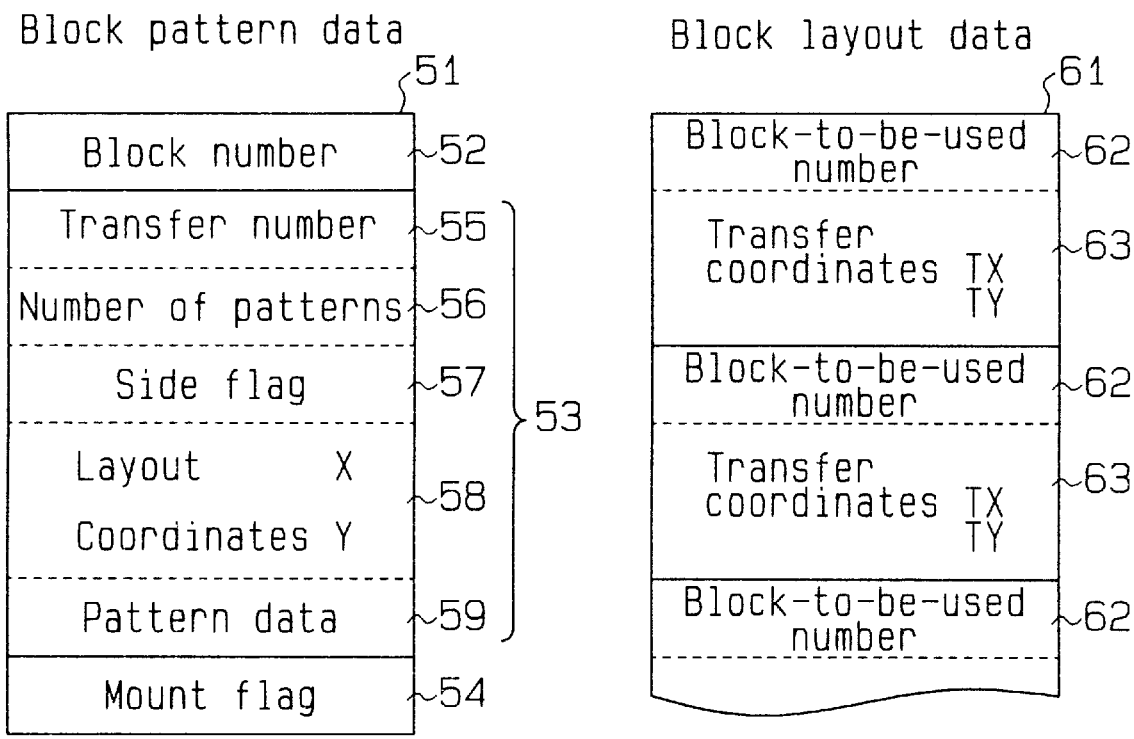
FIG. 6 is a schematic diagram showing various kinds of data involved in the mounting block determining process.

As shown in FIG. 6, block data comprises block pattern data 51 and block layout data 61. The CPU 32 in FIG. 3 stores the block pattern data 51 in the fifth data file 45 and the block layout data 61 in the sixth data file 46.

As shown in FIG. 6, the block pattern data 51 has a block number 52, block information 53 and a mount flag 54. The block number 52 is given to each block pattern data 51 to distinguish one block from another. The block information 53 includes the shape of a block and the number of common portions (hereinafter referred to as "transfer number 55") that were extracted as a block. As shown in FIG. 6, the block information 53 further includes a pattern number 56, a side flag 57, block layout coordinate area 58 and pattern data 59. That information is stored in associated memory areas 52 to 59 in the fifth data file 45.

The transfer number 55 indicates the number of patterns to be subjected to block exposure. The transfer number 55 influences the durability of a stencil mask 65 shown in FIG. 8. More specifically, the larger the transfer number 55 is, the quicker the degradation of the associated block gets, which reduces the durability of the stencil mask 65. Reducing the transfer number 55 per block therefore suppresses the deterioration of the stencil mask 65.

The pattern number 56 indicates the number of patterns of layout data included in the associated block, and is the number of rectangular segments divided from a layout pattern. If blocks, each having a large pattern number 56, are mounted on the stencil mask 65 shown in FIG. 8, the number of patterns to be exposed with a single shot of a beam increases. This shortens the exposure time.

The side flag 57 indicates whether or not a side having an arbitrary angle is included in the associated block. The "side having an arbitrary angle" means a side having an angle other than an integer multiple of 45° with respect to one of two reference axes (X axis or Y axis) at the time of exposing the layout pattern of an LSI. Normally, one side of an LSI chip is assigned to the X axis, and a side perpendicular to the X axis is assigned to the Y axis.

In general, if a layout pattern includes a side having an arbitrary angle, this layout pattern is divided along the X axis or Y axis and exposed with a rectangular electron beam by the electron beam exposure apparatus 10. Consequently, such a side having an arbitrary angle is exposed stepwise so that the edge of the layout pattern will not be a straight line.

In contrast, the CPU 32 in the embodiment sets "1" to the side flag 57 when a layout pattern includes a side having an arbitrary angle, and sets "0" to the side flag 57 when otherwise. When the side flag 57 is set, the CPU 32 mounts a block including a side having an arbitrary angle on the stencil mask 65 shown in FIG. 8. This scheme allows the edge of the layout pattern to be exposed linearly and is effective in shortening the exposure time by the elimination of the necessity of segmenting a layout pattern before being drawn.

Figure 8:
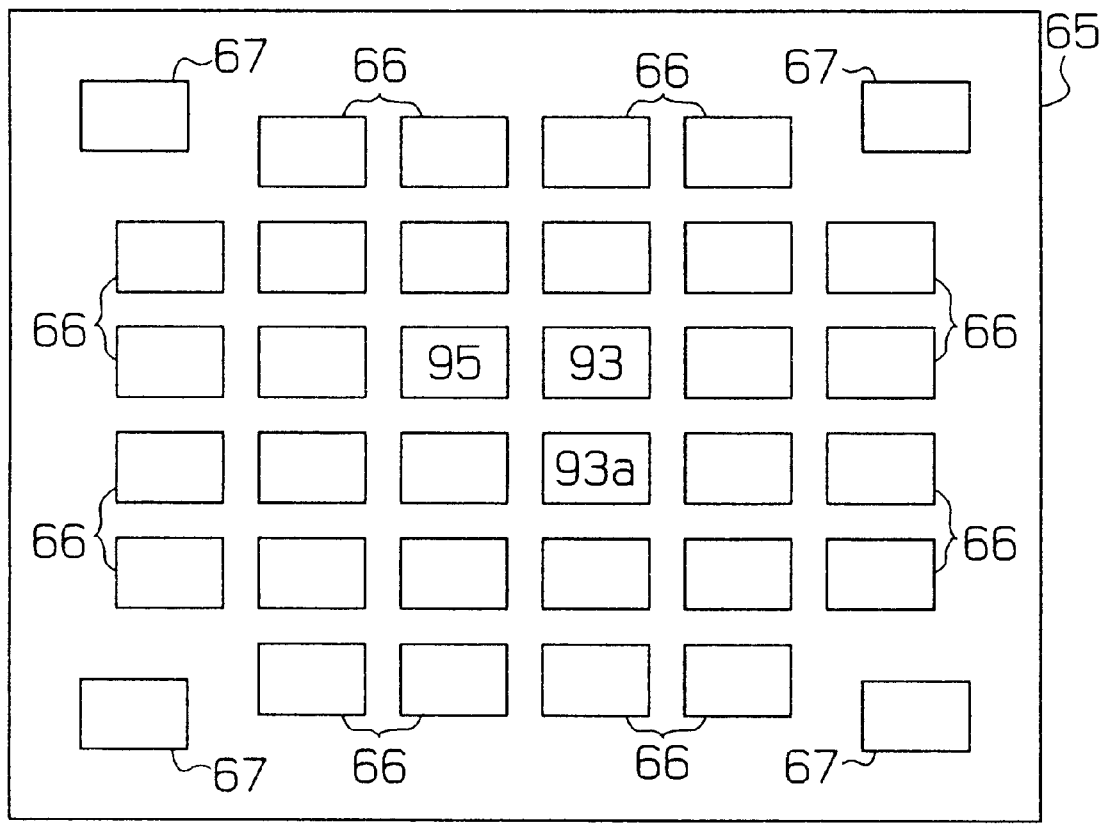
FIG. 8 is a plan view of a stencil mask according to the first embodiment.

The block layout coordinate area 58 holds the values of the coordinates of a block to be mounted on the stencil mask 65 in FIG. 8. The pattern data area 59 stores data of a layout pattern to be mounted on a block.

The mount flag 54 indicates whether or not the associated block is mounted on the stencil mask 65 in FIG. 8. Since the number of blocks to be mounted on the stencil mask 65 is physically limited due to the area of the stencil mask, the flag 54 is used to distinguish block data to be mounted from block data not to be mounted. In this embodiment, the number of blocks mountable on the stencil mask 65 is "32".

Stored in the block layout data 61 (see FIG. 6) of the fifth data file 45 are a block-to-be-used number 62 and transfer coordinates 63. The block-to-be-used number 62 indicates the number of a block stored in the block pattern data area 51, and the transfer coordinates 63 indicate the coordinates on the wafer 19 where a block pattern specified by that block number is transferred. According to this embodiment, therefore, a set of a block-to-be-used number 62 and transfer coordinates 63 are prepared for one pattern to be drawn on the wafer 19.

In determining a block to be mounted on the stencil mask 65, the CPU 32 in FIG. 3 refers to the block information of the block pattern data 51 stored in the fifth data file 45 and block copy conditions 64 described in a control statement 48. Accordingly, the CPU 32 arranges a plurality of blocks having the same pattern on the mask 65 to reduce the number of exposures per block.

Figure 7:
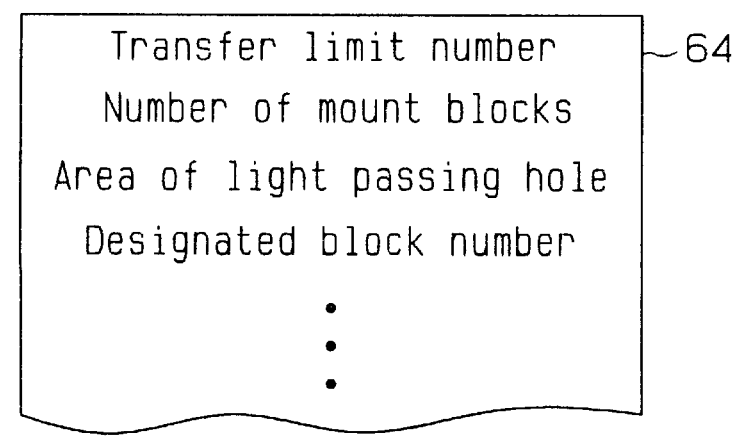
FIG. 7 is an explanatory diagram showing block copy conditions.

As shown in FIG. 7, the block copy conditions 64 include a transfer limit number (or the transfer unit number), a designated-block number and the area of the light passing hole. The conditions 64 have previously been set in consideration of the number of chips to be prepared, the condition of the exposure apparatus 10 and so forth. In the specification, "copy" means the preparation of data for forming a plurality of patterns of the same shape on the mask, and "transfer" means the exposure of the wafer in accordance with the shape. The "transfer limit number" or "transfer unit number" means the upper limit of the number of patterns that can be transferred using a single block.

In the designated-block number area in the copy conditions 64, the block number 52 of the block pattern data 51 that a user has decided to mount on the stencil mask 65 based on the pattern data 59 of the extracted block is stored. The user determines whether the pattern data 59 of an extracted block should be mounted, based on the figure displayed on, for example, the CRT 35.

In making the determination, the user considers the following points. The larger the block transfer number 55 is, the more impurities will adhere to the stencil mask 65 in FIG. 8. Such impurities lower the transmittance of the electron beam and the durability of the stencil mask 65. Further, a block having a large transfer number 55 causes the temperature of the stencil mask 65 to increase due to the heat generated by the electron beam. Exposure to heat makes the block pattern more susceptible to breakage, thus reducing the durability of the stencil mask 65.

Furthermore, some block patterns may increase the heat generated by the irradiation of an electron beam or may make escape of the heat difficult in accordance with their areas. Those blocks, even if the transfer numbers 55 are small, increase the temperature of the stencil mask 65 and thus lead to decreased durability of the stencil mask 65.

By dividing a block having a large transfer number 55, and thus a reduced durability, into a plurality of block segments and by appropriately arranging those segments on the stencil mask 65, therefore, fewer impurities stick onto a single block and an excessive rise in the temperature of the stencil mask 65 is avoided. This helps to maintain the transmittance of the electron beam and makes the breakage of block patterns more difficult. Thus, the durability of the stencil mask 65 is improved. Further, the appropriate arrangement of a plurality of blocks, the patterns of which make it difficult for heat to escape, suppresses a rise in the temperature of the stencil mask 65. This makes the breakage of block patterns difficult, thus improving the durability of the stencil mask 65. In view of the above, the block copy conditions are set so increase the durability of the stencil mask 65 in FIG. 8.

The CPU 32 in FIG. 3 determines the number of blocks to be copied based on the input block copy conditions and the block information of each block, and copies the block pattern data 51 in the fifth data file 45 in FIG. 4 in accordance with that determined number. The CPU 32 further sets or designates a block having the copied block pattern data 51 to a mounting block. The CPU 32 therefore stores a plurality of mounting blocks having the same shape in the data file 45.

The CPU 32 also approximately evenly distributes the block layout data 61 shown in FIG. 6 to a plurality of mounting blocks. Specifically, the CPU 32 stores the block numbers 52 of the individual copied blocks in the block-to-be-used number 62 of the block layout data 61 in FIG. 6.

The approximately even distribution of the block layout data 61 to copied blocks makes the numbers of uses of the individual blocks approximately the same. As a result, the amount of impurities adhered to each block mounted on the stencil mask 65 is less and good transmittance of the electron beam is maintained, thus improving the durability of the stencil mask 65. Further, the amount of heat generated by the irradiation of an electron beam per block is reduced to thereby suppress an increase in the temperature of the stencil mask 65.

After determining a mounting block, the CPU 32 in FIG. 3 acquires the block pattern data 51 in the fifth data file 45 and transfers the block layout data 61 of the mounting block to the third data file 43 as block output data. The block output data is used to prepare the stencil mask 65 in FIG. 8. Specifically, a block pattern is formed on each block area 66 on the stencil mask 65 based on the block pattern data 51. As a result, a plurality of blocks having the same pattern shape are laid out on the stencil mask 65.

The CPU 32 converts the block layout data 61 corresponding to the mounting block to exposure data and stores the exposure data in the fourth data file 44 in FIG. 4. Further, the CPU 32 reads layout data of a block other than the mounting block from the intermediate data in the second data file 42 in FIG. 4 and converts it to exposure data, which is in turn stored in the fourth data file 44.

Figure 1:
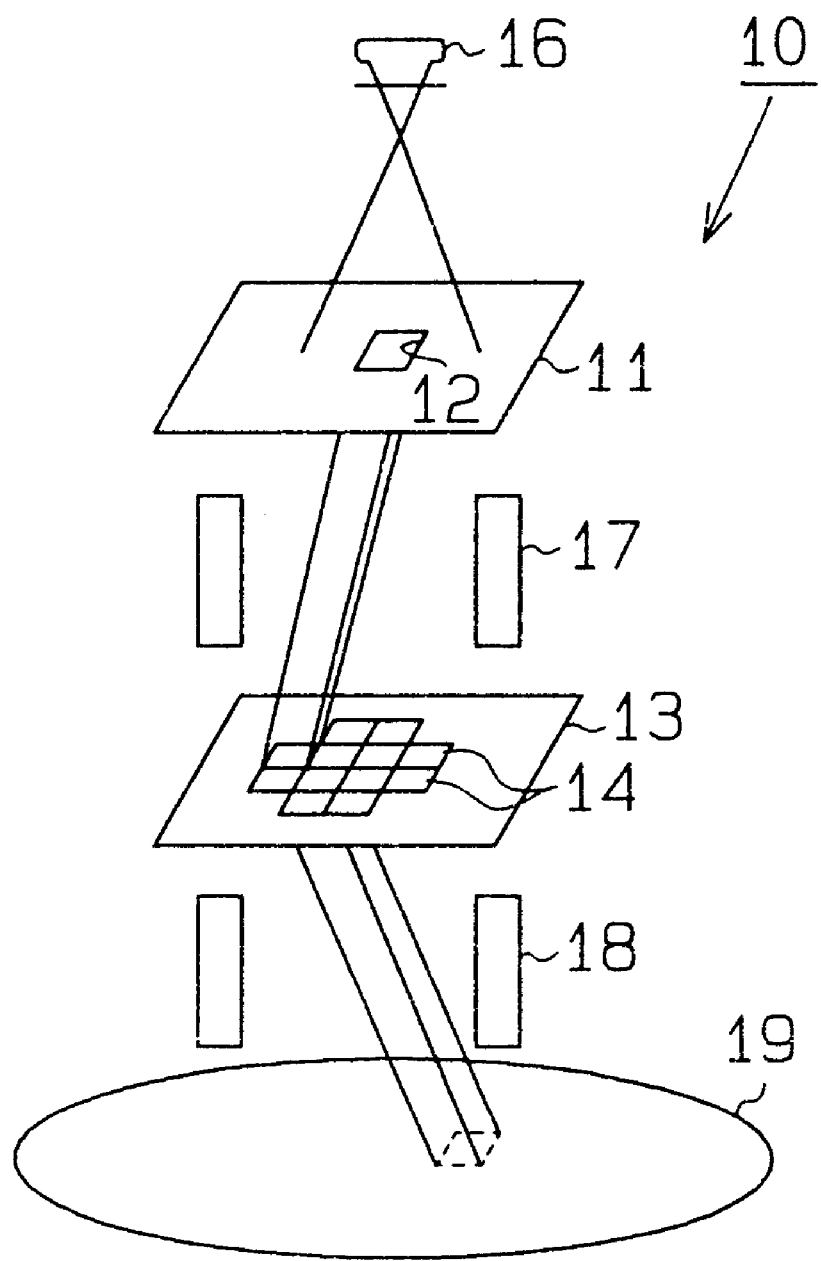
FIG. 1 is a schematic diagram illustrating an electron beam exposure apparatus that executes block exposure.
Figure 2:
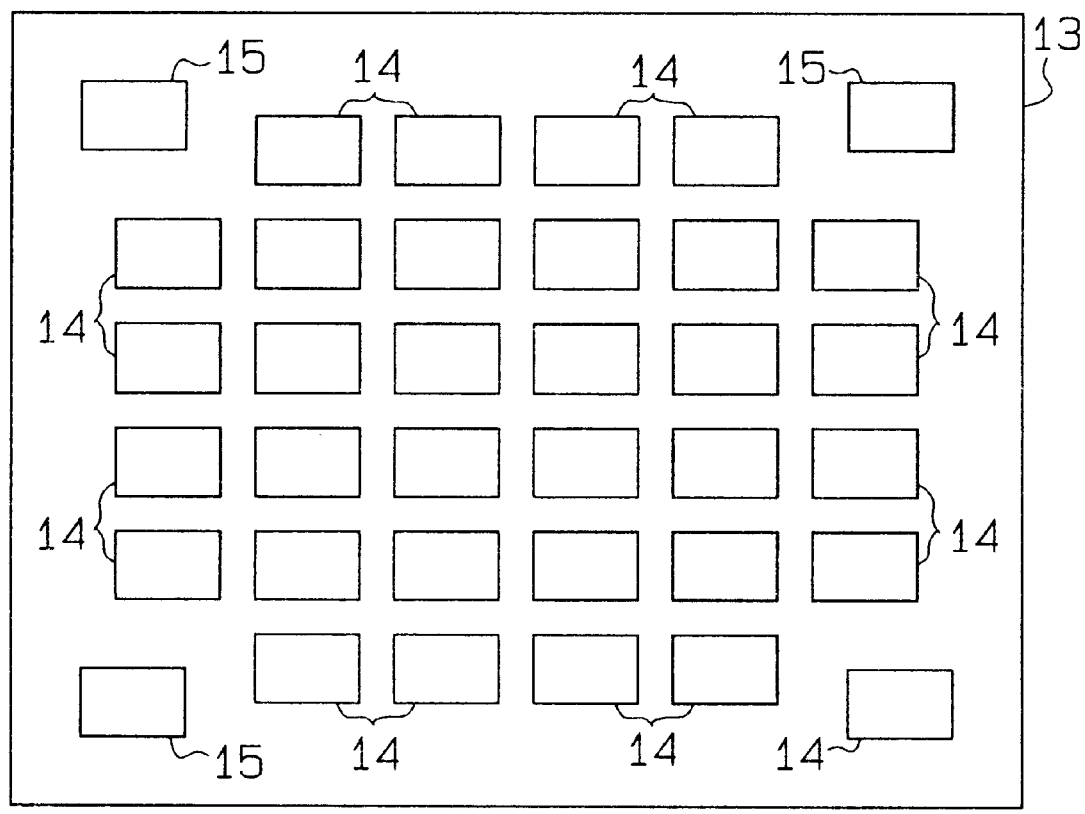
FIG. 2 is a plan view of a conventional stencil mask.

The exposure data of the mounting block is used to control the first and second electromagnetic deflectors 17 and 18 of the electron beam exposure apparatus 10 shown in FIG. 1. The first electromagnetic deflector 17 is controlled on the basis of the layout coordinates of the block pattern data 51 of the mounting block.

The electron beam emitted from the beam source 16 is selectively irradiated on one of the block areas on the stencil mask 65 in FIG. 8 by the first electromagnetic deflector 17 to be formed (shaped) based on the block pattern formed in that block area. The shaped electron beam is further deflected by the second electromagnetic deflector 18 to be irradiated on the wafer 19 at a predetermined position (transfer coordinates TX, TY), thus exposing the block pattern.

The first electromagnetic deflector 17 in FIG. 1 is also controlled on the basis of exposure data corresponding to layout data of a block other than the mounting block. In this case, the electron beam emitted from the beam source 16 is irradiated while being shifted to the rectangular window 67 of the stencil mask 65 in FIG. 8. Based on the amount of the deviation of the beam with respect to a rectangular window 67, the electron beam is shaped to have a predetermined rectangular cross section. The shaped electron beam is deflected and irradiated at a predetermined position on the wafer 19 by the second electromagnetic deflector 18, thus exposing a predetermined layout pattern.

The action of the thus constituted exposure data generating apparatus 31 will be described below with reference to the flowcharts illustrated in FIGS. 4 and 5. The CPU 32 of the exposure data generating apparatus 31 operates in accordance with the flow charts illustrated in FIGS. 4 and 5 and initiates the exposure data generating process in accordance with the operation of the keyboard 36.

First, in step 71 in FIG. 4, the CPU 32 in FIG. 3 acquires basic data (layout data) from the data file 41. In the next step 72, the CPU 32 performs predetermined graphic processing, such as an OR operation, sizing process or shrinking process, necessary for preparing the exposure data of an LSI, on the basic data. Then, the CPU 32 stores layout data after the graphic processing as intermediate data in the second data file 42 on the magnetic disk 34. Then, the CPU 32 proceeds to step 73 from step 72.

In step 73, the CPU 32 reads intermediate data from the second data file 42 shown in FIG. 4. The CPU 32 then receives the control statement 47 shown in FIG. 4 entered through the keyboard 36 in step 74. The control statement 47 includes the block extraction conditions and the number of mounting blocks. Based on the block extraction conditions, the CPU 32 extracts portions having a common pattern from the intermediate data as blocks. Then, the CPU 32 stores the block pattern data 51 of the extracted blocks in the fifth data file 45 in FIG. 4. The CPU 32 also stores the block layout data 61 of the extracted blocks in the sixth data file 46 shown in FIG. 4.

Figure 9:
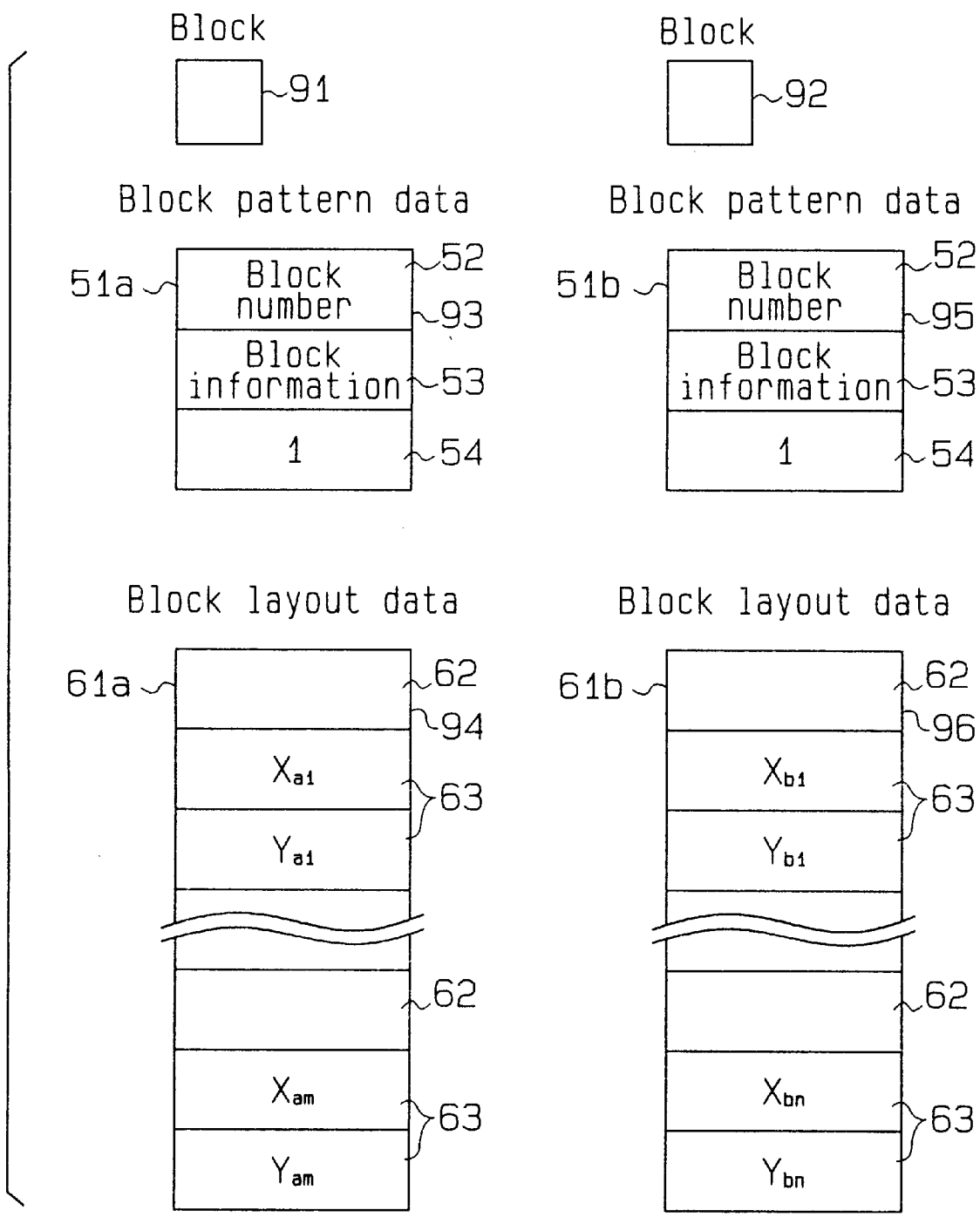
FIG. 9 is an explanatory diagram showing block data according to the first embodiment.

When blocks 91 and 92 in FIG. 9 have been extracted as common portions, for example, the CPU 32 respectively stores block pattern data 51a and block layout data 61a of the block 91 in the fifth and sixth data files 45 and 46 in FIG. 4. The CPU 32 also stores block pattern data 51b and block layout data 61b of the block 92 in the data files 45 and 46, respectively.

In step 75, the CPU 32 determines whether the extraction has been completed. The number of mounting blocks that are input as the control statement 47 is used in the determination. The number of mounting blocks is equal to the number of block areas on the stencil mask 65 in FIG. 8 (which is thirty-two in this embodiment). Therefore, the CPU 32 repeats the process in step 74 until the number of blocks extracted from the intermediate data reaches the number of mounting blocks. As apparent from the above, steps 74 and 75 form the block extracting process. When the block extraction is completed, the CPU 32 moves to step 76 from step 75.

Step 76 is a mounting block determining process that is illustrated in detail in FIG. 5. The CPU 32 determines a block to be mounted on the stencil mask 65 in accordance with the flowchart in FIG. 5.

Step 81 in FIG. 5 is a copy condition input process (copy condition input means). In this step, the CPU 32 receives the control statement 48 including the block copy conditions that have been entered through the keyboard 36. As mentioned earlier, the block copy conditions include a transfer limit number, a designated-block number and the area of the light passing hole. The transfer limit number and the area of the light passing hole have previously been set in consideration of the number of chips to be prepared and the condition of the exposure apparatus 10, while the designated-block number is set by the user based on the block pattern data 51 of the extracted block. When the block copy conditions are input, the CPU 32 goes to step 82 from step 81.

Step 82 is a sorting process in which the CPU 32 sorts block data in the fifth data file 45 in FIG. 4 based on three previously-set keys. The keys are the transfer number 55, the number of patterns 56 in a block and the presence/absence of a side having an arbitrary angle, which are included in the block information 53 in the block pattern data 51 in FIG. 6. The CPU 32 sorts the block pattern data 51 using the transfer number 55 as the first key, the pattern number 56 in a block as the second key and the presence/absence of a side having an arbitrary angle as the third key. After finishing the sorting process, the CPU 32 advances to step 83 from step 82.

Step 83 in FIG. 5 is a data input process in which the CPU 32 receives the block pattern data 51 from the fifth data file 45. When there is no block pattern data 51 to be input, the CPU 32 terminates the mounting block determining process. When the block pattern data 51 has been received, the CPU 32 proceeds to step 84 from step 83.

Step 84 is a mounting block setting process in which the CPU 32 sets the block pattern data 51 received in the previous step 83 as a mounting block. Specifically, the CPU 32 sets the mount flag 54 in the block pattern data 51 in FIG. 6 to "1".

If the blocks 91 and 92 shown in FIG. 9 have previously been extracted and if they are sorted in step 82, for example, the CPU 32 receives the block pattern data 51a of the block 91 first and then sets the mount flag 54 of the block pattern data 51a to "1".

Step 85 in FIG. 5 is a copy condition determining process in which the CPU 32 determines whether the received block pattern data 51 satisfies the copy condition. When the transfer limit number has been set as a copy condition, for example, the CPU 32 compares the transfer limit number with the transfer number 55 of the block pattern data 51a in FIG. 9. When the transfer number 55 is greater than the transfer limit number, the CPU 32 in FIG. 3 determines whether the block pattern data 51 satisfies the copy condition and determines that the block pattern data should be copied in such a way that the transfer number per block becomes equal to or smaller than the transfer limit number. In this case, the CPU 32 moves to step 86 from step 85 shown in FIG. 5.

When the transfer number 55 does not exceed the transfer limit number, the CPU 32 in FIG. 3 determines that the block pattern data 51 does not satisfy the copy condition. In this case, the CPU 32 moves to step 89 from step 85 shown in FIG. 5.

Step 86 in FIG. 5 is a copying process in which the CPU 32 copies a block pattern. To distinguish original block pattern data 51 from copied block pattern data, the original block pattern data 51 will be called "original pattern data" and the copied block pattern data "copied pattern data" hereinafter.

When the transfer limit number is set as the copy condition, for example, in making a copy, the CPU 32 performs copying of the block pattern data 51 at least once for each transfer limit number in order to acquire the block pattern data 51 corresponding to the previously set transfer number 55. When the sum of the original pattern data and the copied pattern data reaches the transfer number 55, the copying process is stopped. Consequently, copied pattern data for the necessary number of blocks for the proper distribution of the transfer number 55 is acquired.

Figure 10:
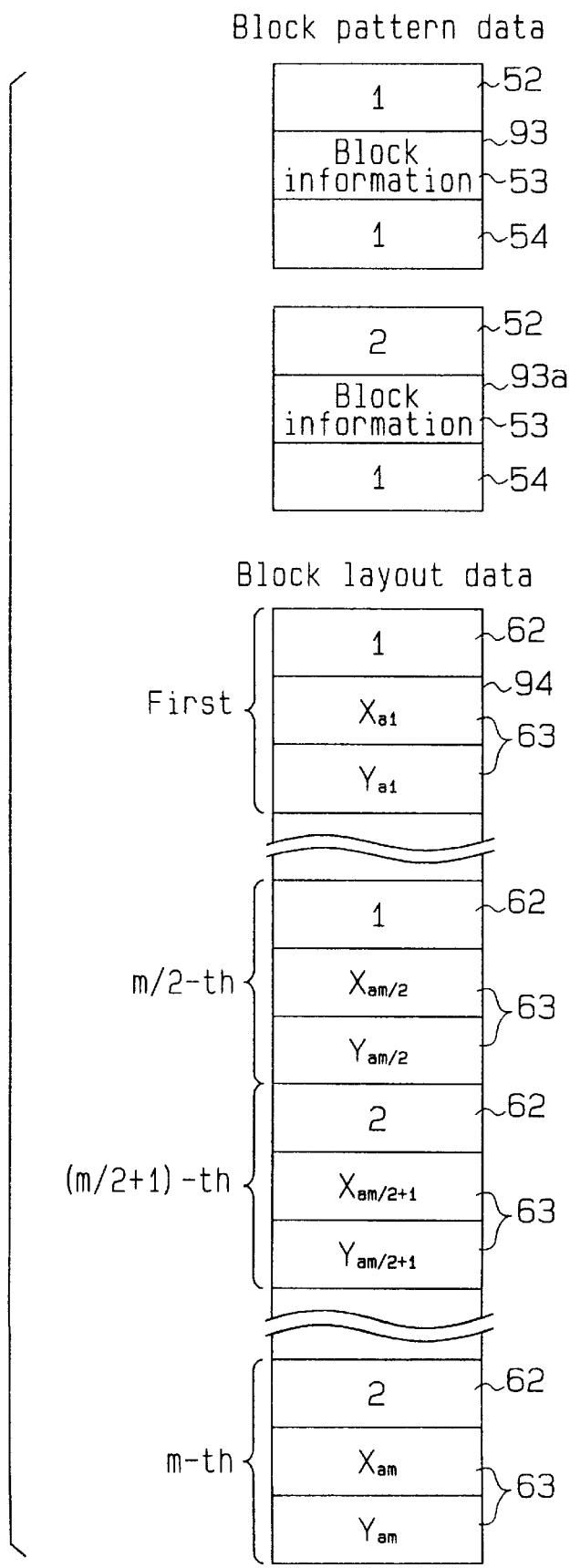
FIG. 10 is an explanatory diagram showing block data after copying according to the first embodiment.

When it is determined that the block information 53 of block pattern data 93 meets the copy conditions based on the block information 53 stored in the block pattern data 51a of the block 91 shown in FIG. 9 for example, the CPU 32 generates copied pattern data 93a obtained by copying the original pattern data 93 as shown in FIG. 10. Then, the CPU 32 sets the block number 52 of the original pattern data 93 to "1" and sets the block number 52 of the copied pattern data 93a to "2" to distinguish the original pattern data 93 from the copied pattern data 93a.

Step 87 in FIG. 5 is a mounting block setting process in which the CPU 32 sets the copied pattern data that has been copied in the previous step 86 as a mounting block. Specifically, the CPU 32 sets the mount flag 54 of the copied pattern data 93a shown in FIG. 10 to "1" to set the copied pattern data 93a as a mounting block.

Step 88 is a distributing process in which the CPU 32 distributes the block layout data 61 shown in FIG. 6 so that the number of pieces of data to the copied blocks are approximately evenly distributed. Specifically, the CPU 32 in FIG. 3 stores the block numbers of the individual copied blocks in the block-to-be-used number area 62 of the block layout data 94 in FIG. 10.

Suppose that the number of pieces of data of the block layout data 94 is "m" in distributing the individual pieces of data of the block layout data 94 in FIG. 10 to the original pattern data 93 and the copied pattern data 93a. In this case, the CPU 32 sets "1", which is the block number of the original pattern data 92, as the individual block-to-be-used numbers 62 of the block layout data 94 from the first data to the (m/2)-th data. Then, the CPU 32 sets "2", which is the block number of the copied pattern data 93a, as the individual block-to-be-used numbers 62 from the (m/2+1)-th data to the m-th data.

Therefore, the number of copies of the original pattern data 93 and the number of copied pattern data 93a are both m/2. The copy number, m/2, or the transfer number can be set equal to or smaller than the transfer limit number. This reduces the amount of impurities adhered to each block on the stencil mask based on those pattern data.

In the next step 89 in FIG. 5, the CPU 32 compares the number of blocks set as mounting blocks with the number of blocks mountable on the stencil mask 65 in FIG. 8 and determines whether a further block is mountable on the stencil mask 65. When determining that further mounting is possible, the CPU 32 proceeds to step 83 from step 89 in FIG. 5 to receive the next block data.

In step 83 in FIG. 5, the CPU 32 receives block pattern data 95 of the block 92 shown in FIG. 9 as the next block data. Then, the CPU 32 repeats the sequence of processes from steps 84 to 88 in FIG. 5 based on the block information 53 of the block pattern data 95. Since those processes have already been explained, their description will not be repeated.

When it is determined in step 89 in FIG. 5 that no further block is mountable on the stencil mask 65, the CPU 32 goes to step 90 from step 89. In step 90, the CPU 32 sets all the remaining block data as non-mounting blocks and terminates the mounting block determining process. When all the mounting blocks have been determined, the CPU 32 terminates the exposure data determining process shown in FIG. 5 and returns to step 77 in FIG. 4.

Step 77 is a block data outputting process in which the CPU 32 stores the block data of mounting blocks as block output data in the third data file 43 in FIG. 4. Specifically, the CPU 32 receives the block pattern data 51 designated as a mounting block, i.e., the pattern data 93 and 93a for which the mount flag 54 has been set to "1", from the fifth data file 45 in FIG. 4.

Further, the CPU 32 receives the block layout data 94 corresponding to the mounting block from the sixth data file 46 shown in FIG. 4. Then, the CPU 32 stores the received pattern data 93 and 93a and block layout data 94 as block output data in the third data file 43 in FIG. 4. The CPU 32 also receives the block pattern data 95 for which the mount flag 54 has been set to "1" and block layout data 96 and stores them as block output data in the third data file 43. Based on the block output data, the stencil mask 65 shown in FIG. 8 is prepared.

Block patterns of the same shape are formed on two selected block areas 66 on the stencil mask 65 based on the pattern data 93 and 93a. A block pattern based on the block pattern data 95 is formed on a desired block area 66 on the stencil mask 65.

Steps 78 and 79 each are an exposure data converting process. First, the CPU 32 converts the layout pattern to be exposed through a block to exposure data and stores the exposure data in the fourth data file 44 in step 78. Specifically, the CPU 32 receives the block output data from the third data file 43, converts the data to exposure data, and stores the exposure data into the fourth data file 44.

The pattern data 93, 93a and 95, and block layout data 94 and 96 of the mounting block, shown in FIGS. 8 and 9, are stored in the third data file 43 in the previous step 77. The CPU 32 thus converts the block pattern and block layout data of the mounting block to exposure data and stores the exposure data in the fourth data file 44.

In the next step 79, the CPU 32 converts the layout patterns that are not exposed through a block to exposure data and stores the exposure data in the fourth data file 44. The layout patterns that are not exposed include the layout pattern of blocks that have not been set as a mounting block in step 76 and the layout patterns that have not been extracted as a block in step 74.

Subsequently, the CPU 32 reads intermediate data of a block other than the mounting block from the second data file 42 and converts the intermediate data to exposure data, which is in turn sent to the fourth data file 44.

In short, the apparatus of the embodiment has the following function and advantages.

The mounting block determining apparatus 31 extracts blocks from the layout pattern of a semiconductor device as common portions and stores the block pattern data 51 and block layout data 61 of each block to the fifth and sixth data files 45 and 46. Based on the block information 53 of the block pattern data 51 and the input block copying conditions, the CPU 32 designates a predetermined block as a mounting block. Further, the CPU 32 copies plural pieces of mounting block pattern data and distributes the block layout data 61 to the copied block pattern data 51 approximately evenly.

Therefore, the number of times each block is used at the time of exposure is approximately the same as that of the other blocks. This reduces the amount of impurities adhering to a single block and helps to maintain the transmittance of the electron beam that passes through each block. Further, the amount of heat generated by the irradiation of an electron beam per block is reduced to suppress a rise in the temperature of the stencil mask 65. This makes breakage of a block pattern more difficult and improves the durability of the stencil mask 65.

The improved durability of the stencil mask 65 reduces the frequency of replacement of the stencil mask 65 in the electron beam exposure apparatus 10 shown in FIG. 1. It is thus possible to shorten the preparation time for the stencil mask 65, to reduce the number of exposure interruptions for replacing the stencil mask 65, and to reduce the time for adjusting the exposure on the stencil mask 65 or the like.

The second embodiment of the invention will now be discussed with reference to FIGS. 11 through 14.

Figure 11:
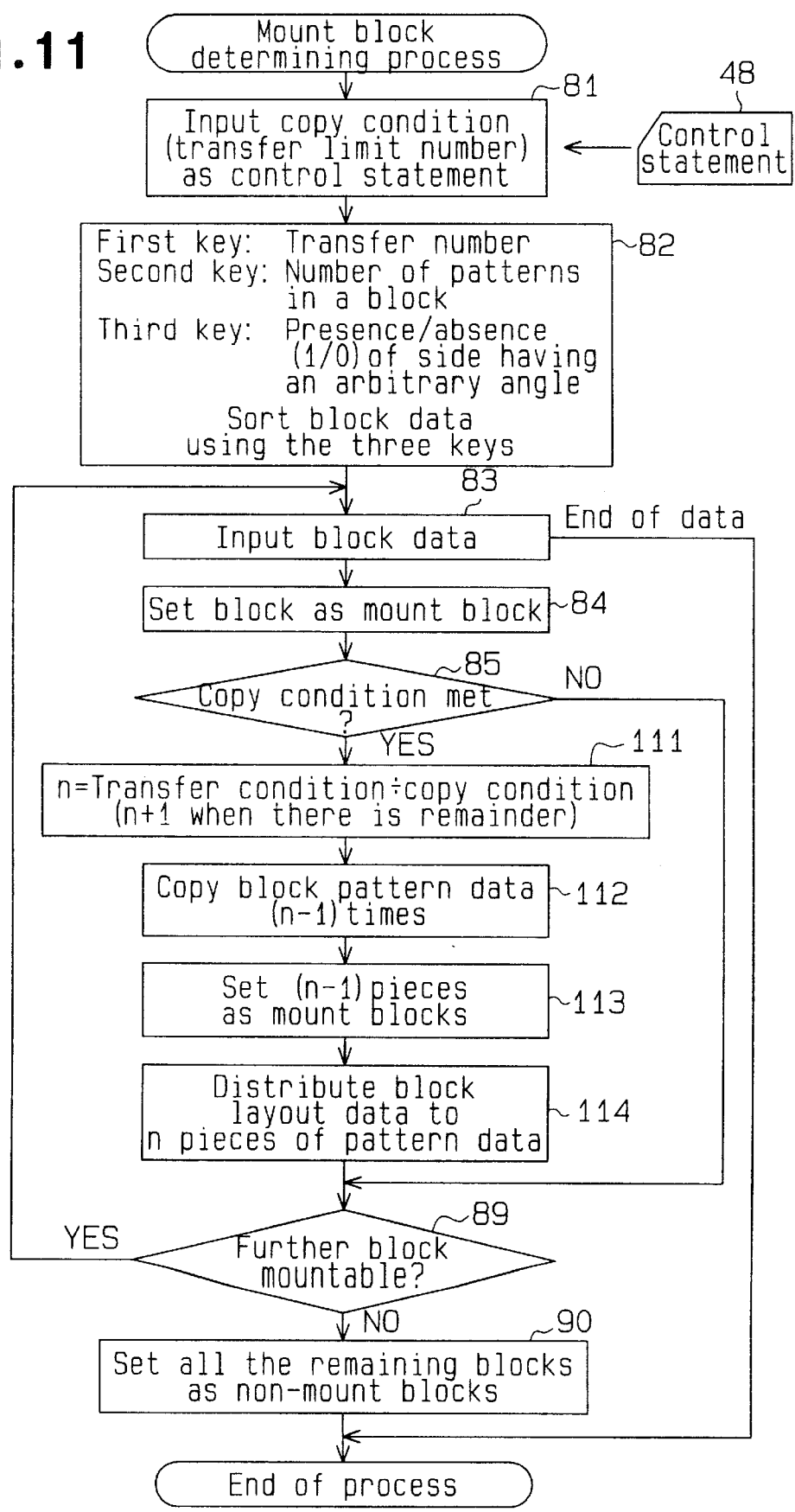
FIG. 11 is a flowchart for a mounting block determining process according to the second embodiment of the invention.

According to this embodiment, the mounting block determining process in the first embodiment shown in FIG. 5 is replaced with the one illustrated in FIG. 11.

To avoid a redundant description, like or same reference numerals are given to those components that are like or the same as the corresponding components of the first embodiment.

Figure 12:
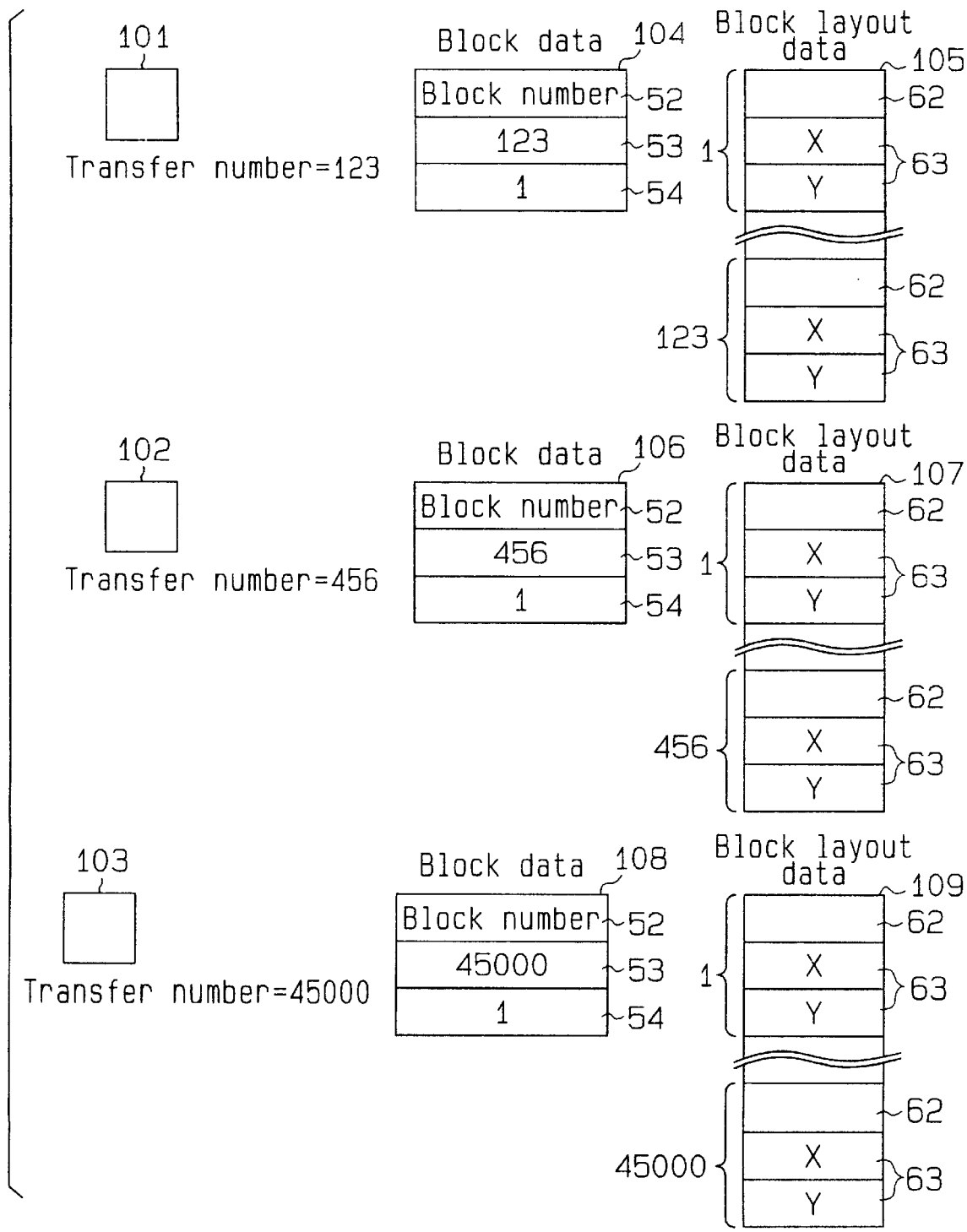
FIG. 12 is an explanatory diagram showing block data according to the second embodiment.

In the following description, it is provided that blocks 101, 102 and 103 shown in FIG. 12 are sequentially extracted and are stored in the associated data files in the extraction order in the block extracting process in step 74 in FIG. 4. Note that the blocks 101–103 have basic layout patterns having different shapes and different transfer numbers.

With regard to the block 101, its block pattern data 104 and block layout data 105 are respectively stored in the fifth and sixth data files 45 and 46 shown in FIG. 4. As shown in FIG. 12, the transfer number of the block 101 is "123" that is stored in the block information area 53 in the block pattern data 104. Stored in the block layout data area 105 are 123 sets of block-to-be-used numbers 62 and transfer coordinates 63.

With regard to the block 102, likewise, its block pattern data 106 and block layout data 107 are respectively stored in the fifth and sixth data files 45 and 46 in FIG. 4. As illustrated in FIG. 12, the transfer number of the block 102, "456", is stored in the block information area 53 in the block pattern data 106. Stored in the block layout data area 107 are 456 sets of block-to-be-used numbers 62 and transfer coordinates 63.

With regard to the block 103, its block pattern data 108 and block layout data 109 are likewise stored in the fifth and sixth data files 45 and 46 in FIG. 4, respectively. As illustrated in FIG. 12, the transfer number of the block 103, "45,000", is stored in the block information area 53 in the block pattern data 108. Stored in the block layout data area 109 are 45,000 sets of block-to-be-used numbers 62 and transfer coordinates 63.

In step 81 in FIG. 11, the CPU 32 in FIG. 3 receives the block copy conditions in the form of the control statement 48. only the transfer limit number is set as the block copy condition in the embodiment.

In the sorting process in step 82 in FIG. 11, the CPU 32 in FIG. 3 sorts the block data stored in the fifth data file 45 in FIG. 4 based on previously set keys. As shown in FIG. 12, the transfer numbers of the blocks 101–103 are "123", "456" and "45,000" respectively. The CPU 32 therefore sorts the three blocks in the order of 103, 102 and 101 based on the transfer number of the first key.

In the subsequent step 83 for the data input process, the CPU 32 sequentially acquires block pattern data from the fifth data file 45. Because the three blocks have previously been arranged in the order of 103, 102 and 101 in the fifth data file 45, the CPU 32 acquires the block pattern data 108 of the block 103 first.

In the next step 84 in FIG. 11 for the mounting block setting process, the CPU 32 sets "1" to the mount flag 54 of the previously input block pattern data 108 and sets the block 103 as a mounting block.

In the condition determining process in step 85, the CPU 32 determines whether the transfer number of the input block pattern data 108 is greater than the transfer limit number that has been input in step 71. In this embodiment, the transfer limit number is set to "10,000". As the transfer number for the block 103 in FIG. 12 is "45,000" that is greater than the transfer limit number, the CPU 32 proceeds to step 111 from step 85.

Step 111 is a copy number computing process in which the CPU 32 computes the number "n" of necessary blocks (hereinafter called "necessary block number"). This necessary block number "n" is the number of blocks for preventing the block information 53 of the block pattern data 108 from exceeding the transfer limit number or the block copy condition at the time of copying the block pattern data 108. The CPU 32 treats a quotient obtained by dividing the transfer number by the transfer limit number as the block number "n." If the division provides a remainder, the CPU 32 adds "1" to the block number "n."

The transfer number of the block 103 in FIG. 12 is "45,000" and the transfer limit number is "10,000." Therefore, the quotient of the division is "4" with a remainder of "5000." Accordingly, the CPU 32 sets the block number "n" to "5" (4+1).

Figure 13:
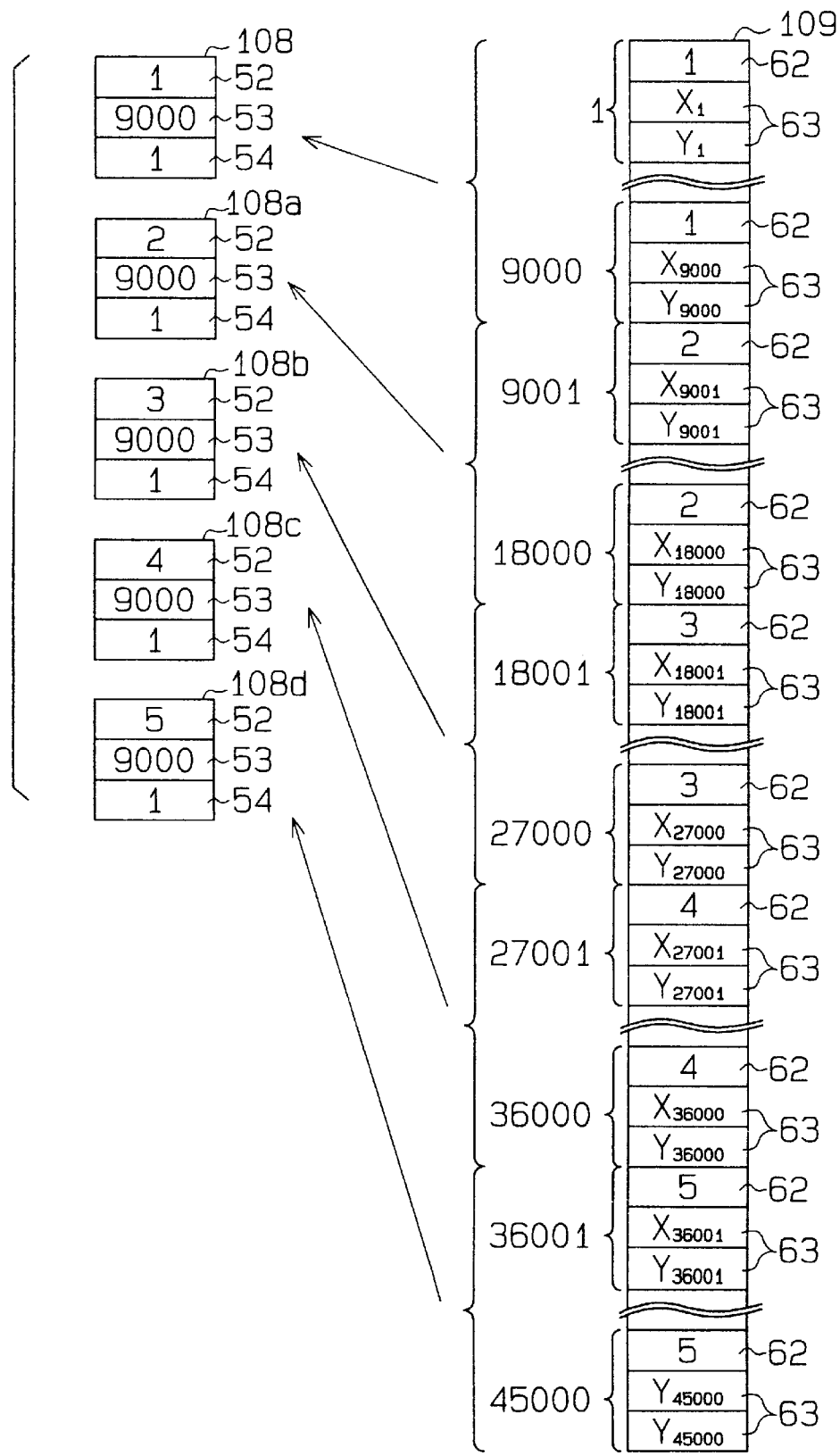
FIG. 13 is an explanatory diagram showing block data after copying according to the second embodiment.

Step 112 is a copying process in which the CPU 32 copies the block pattern based on the necessary block number "n" obtained in the previous step 111. As the necessary block number "n" is "5", the CPU 32 forms (n−1=4) pieces of copied pattern data (the quantity being "1" or the number of original pattern data subtracted from the necessary block number "n") by copying. As shown in FIG. 13, therefore, the block pattern data 108 of the block 103 shown in FIG. 12 includes five pieces of block pattern data, which are one original pattern data 108 and four pieces of copied pattern data 108a–108d.

Step 113 in FIG. 11 is a mounting block setting process in which the CPU 32 sets "1" to the mount flags 54 of the previously copied pattern data 108a–108d. The CPU 32 also sets data distinction numbers in the block number areas 52 of the original pattern data 108 and the copied pattern data 108a, as shown in FIG. 13. As illustrated in FIG. 13, for example, the CPU 32 sets "1" to the block number 52 of the original pattern data 108 and respectively sets "2" to "5" to the block numbers 52 of the copied pattern data 108a to 108d.

Figure 14:
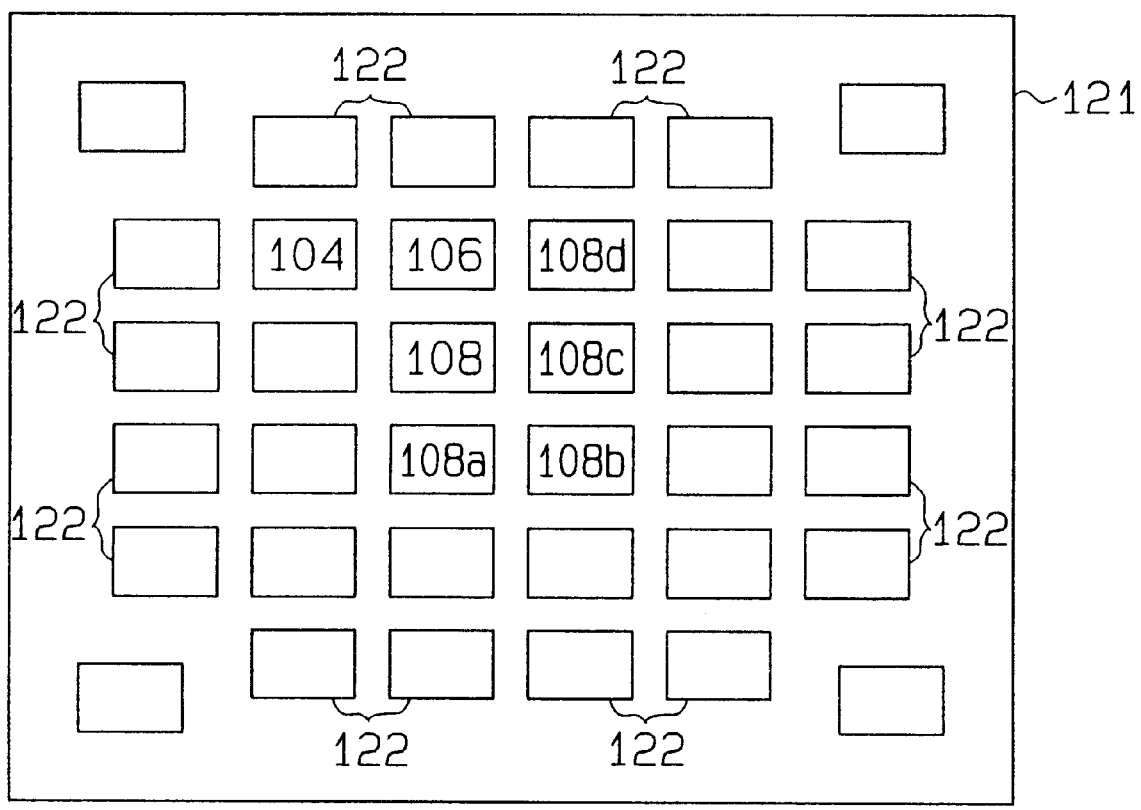
FIG. 14 is a plan view of a stencil mask according to the second embodiment.

Further, the CPU 32 sets the layout coordinates (equivalent to the layout coordinates 58 in FIG. 6) of the original pattern data 108 and the copied pattern data 108a–108d set as mounting blocks. At this time, the CPU 32 arranges the individual pattern data 108 and 108a–108d in a spiral form with respect to a plurality of block areas on a stencil mask 121, as shown in FIG. 14.

At this time, the original pattern data 108 is laid out at the position where a perpendicular line extending from the beam source 16 to the wafer 19 in the exposure apparatus 10 in FIG. 1 intersects the surface of the stencil mask 121. An electron beam that travels along the optical path on the perpendicular line irradiates the mask without being deflected by the first and second electromagnetic deflectors 17 and 18. Thus, the electron beam on the optical path suffers the least deformation. As the electron beam is shifted from the optical path, the deformation becomes greater so that the electron beam passing block areas 122 at the periphery of the stencil mask 121 is deformed. However, the deformation is practically negligible.

Therefore, blocks having larger transfer numbers are positioned closer to the perpendicular line, which extends from the beam source 16 to the wafer 19, to reduce the deformation of the electron beam. This ensures high precision exposure.

Step 114 is a distribution process in which the CPU 32 evenly distributes the 45,000 pieces of block layout data 109 to the original pattern data 108 and the copied pattern data 108a–108d as shown in FIG. 13.

More specifically, as shown in FIG. 13, the CPU 32 stores the block number "1" of the original pattern data 108 in the first to 9000th block-to-be-used number areas 62 in the block layout data 109. Likewise, the CPU 32 stores the block number "2" of the copied pattern data 108a in the 9001st to 18000th block-to-be-used number areas 62 in the block layout data 109 and stores the block number "3" of the copied pattern data 108b in the 18001st to 27000th block-to-be-used number areas 62 in the block layout data 109.

Further, the CPU 32 stores the block number "4" of the copied pattern data 108c in the 27001st to 36000th block-to-be-used number areas 62 in the block layout data 109 and stores the block number "5" of the copied pattern data 108d in the 36001st to 45000th block-to-be-used number areas 62 in the block layout data 109.

In step 89 shown in FIG. 11, the CPU 32 determines whether a further block is mountable. At this time, the CPU 32 merely sets a total of five pieces of data, the original pattern data 108 and copied pattern data 108a–108d, corresponding to the block 103 shown in FIG. 12 as mounting blocks, and the number of blocks has not reached "32", which is the number of blocks mountable on the stencil mask 65. Therefore, the CPU 32 determines that a further block is mountable and returns to step 83 shown in FIG. 11.

In step 83, the CPU 32 receives the block pattern data 106 of the block 102 shown in FIG. 12. In the next step 84, the CPU 32 sets "1" to the mount flag 54 of the received block pattern data 106, and designates the block 102 as a mounting block. Note that the number of blocks to be mounted is six.

In the subsequent step 85 in FIG. 11, the CPU 32 determines whether the block information 53 of the block pattern data 106 shown in FIG. 12 satisfies the block copy condition (transfer limit number). Referring to FIG. 12, the transfer number "456", which is smaller than the transfer limit number of "10,000", is stored in the block information area 53 in the block pattern data 106. The CPU 32 therefore determines that the block information 53 of the block pattern data 106 does not meet the block copy condition and proceeds to step 89 from step 85 in FIG. 11.

In step 89, the CPU 32 determines whether the block 102 is mountable on the mask 65 as the sixth mounting block. Because the block 102 is mountable as the sixth mounting block in this example, the decision in step 89 is affirmative (YES) so that the CPU 32 returns to step 83 from step 89. In step 83, the CPU 32 receives the block pattern data 104 of the next block 101 shown in FIG. 12. In step 84, the CPU 32 sets "1" to the mount flag 54 of the block pattern data 104 in FIG. 12 and sets the block 101 as a mounting block. Consequently, the number of blocks to be mounted becomes seven.

In the next step 85 in FIG. 11, the CPU 32 determines whether the block information 53 of the block pattern data 104 in FIG. 12 fulfills the block copy condition. In FIG. 12, the transfer number "123", which is smaller than the transfer limit number of "10,000", is stored in the block information area 53 in the block pattern data 104. The CPU 32 therefore determines that the block 101 does not meet the block copy condition and proceeds to step 89 from step 85 in FIG. 11.

In step 89, since the number of blocks set as mounting blocks is seven, the CPU 32 determines that a further block is mountable. Consequently, the CPU 32 returns to step 83 from step 89. Because mounting every block pattern data has been completed at this point in the example, the CPU 32 finishes the mounting block determining process.

Subsequently, the CPU 32 generates block output data and exposure data based on the pattern data 104, 106, 108 and 108a–108d and the block layout data 105, 107 and 109, all set in the above-described manner, and stores those data in the associated third and fourth data files 43 and 44 shown in FIG. 4.

Based on the block output data stored in the third data file 43, the stencil mask 121 shown in FIG. 14 is prepared. Formed on the block areas 122 on the stencil mask 121 are the block patterns of the original pattern data 108 and copied pattern data 108a–108d, which are associated with the block 103 shown in FIGS. 12, 13, the block pattern of the block pattern data 106 associated with the block 102, and the block pattern of the block pattern data 104 associated with the block 101, as shown in FIG. 12.

The stencil mask 121 is set in the exposure apparatus 10 shown in FIG. 1. The exposure apparatus 10 controls the first and second electromagnetic deflectors 17 and 18 based on the exposure data in the fourth data file 44 shown in FIG. 4. Specifically, first, the exposure apparatus 10 selects the block area 122 on the stencil mask 121 in FIG. 14, on which the original pattern data 108 in FIG. 13 is mounted, and transfers the block pattern of that block area 122 onto the wafer 9,000 times.

Subsequently, the exposure apparatus 10 sequentially selects the individual block areas 122 on which the copied pattern data 108a–108d are mounted, for each of 9,000 transfers, and exposes their block patterns on the wafer.

Therefore, each block area 122 associated with the block 103 is used within the transfer limit number of 10,000. This reduces the amount of impurity adhering to each block area 122 and suppresses a rise in the temperature of the stencil mask 121 caused by the beam as compared with the prior art.

The third embodiment of the invention will now be discussed with reference to FIGS. 15 through 17.

Figure 16:
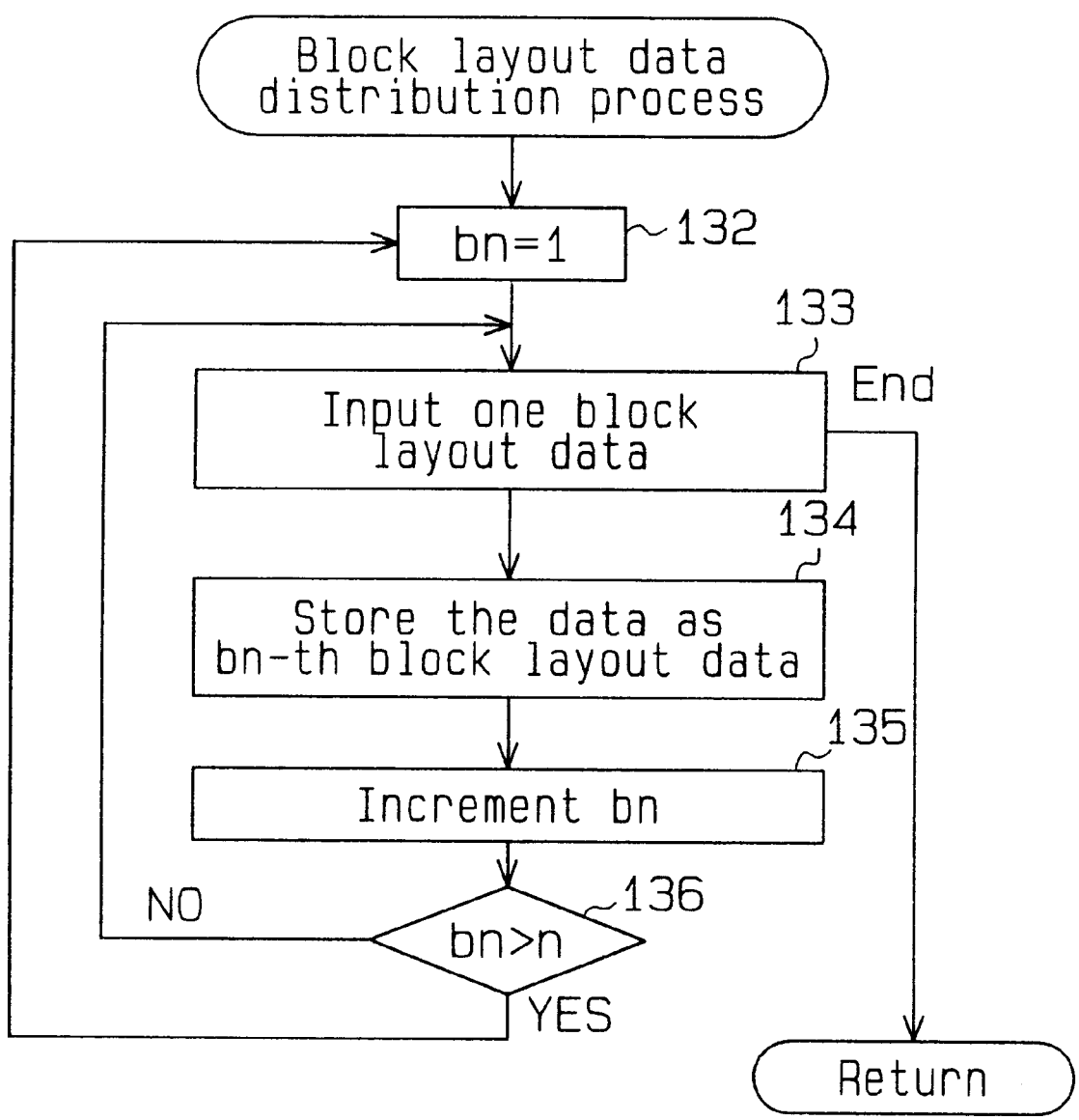
FIG. 16 is a flowchart for a block layout data distributing process according to the third embodiment.

According to the third embodiment, the process in step 114 in FIG. 11 in the second embodiment is replaced with a process in step 131, which includes processes of steps 132 to 136 shown in FIG. 16. In the following description, like or same reference numerals are given to those components and processes that are like or the same as the corresponding components and processes of the first and second embodiments to avoid a redundant description, and the difference between, the third embodiment and the first and second embodiments, or a distribution process illustrated in FIG. 16, will be described in detail.

In the following description of the embodiment, as in the description of the second embodiment, it is provided that blocks 101, 102 and 103 shown in FIG. 12 are extracted in the block extracting process in step 74 in FIG. 4. The block pattern data 104, 106 and 108 and the block layout data 105, 107 and 109 of the individual blocks 101–103 are stored in the associated data files 45 and 46 in FIG. 4.

Figure 17:
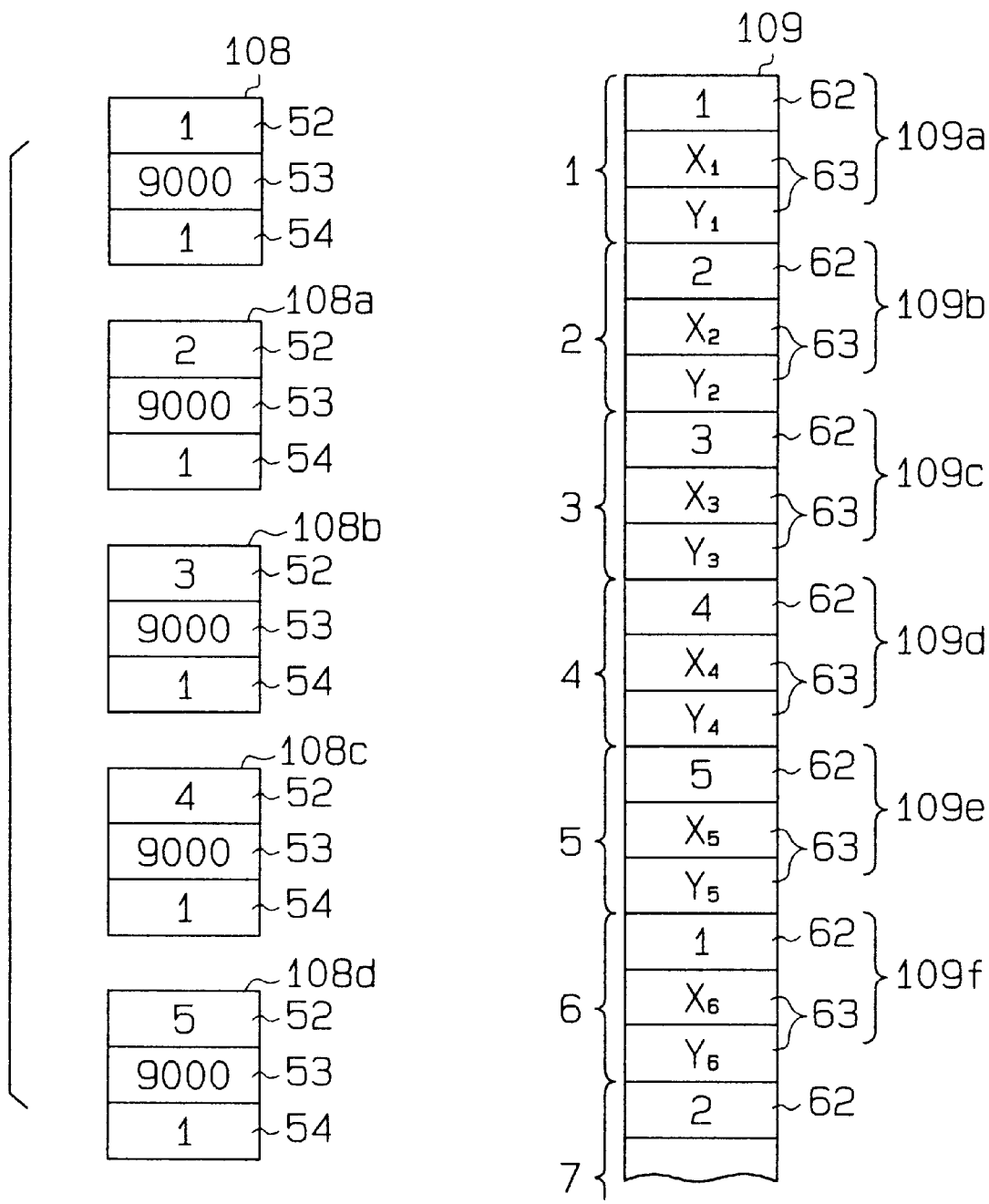
FIG. 17 is an explanatory diagram showing block data after copying according to the third embodiment.

As shown in FIG. 17, the copied pattern data 108a–108d have been copied from the original pattern data 108 based on the block pattern data 108 of the block 103. The value "9,000" is stored as the transfer number in the block information areas 53 of the individual pattern data 108 and 108a–108d.

Figure 15:
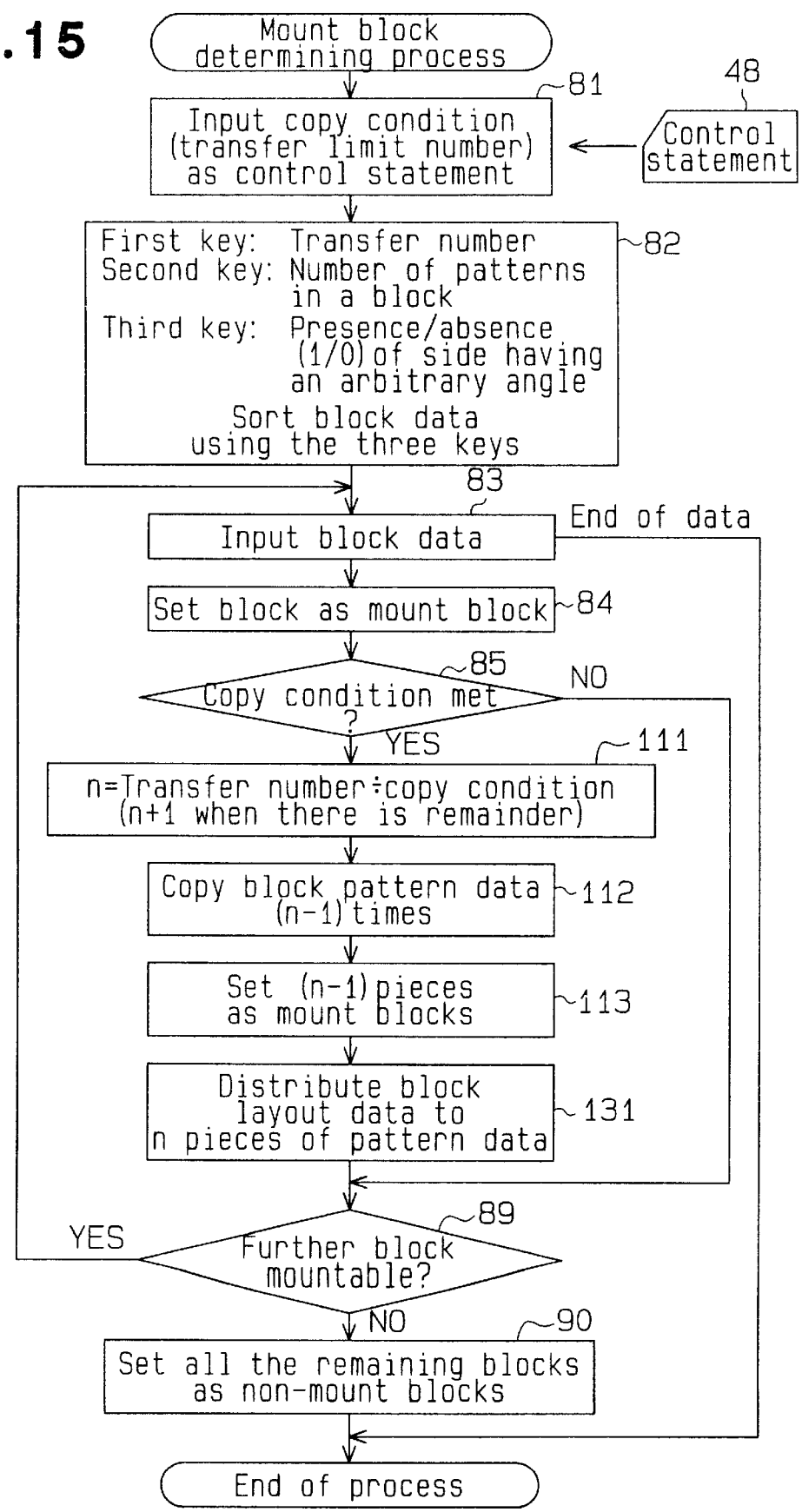
FIG. 15 is a flowchart for a mounting block determining process according to the third embodiment of the invention.

The CPU 32 in FIG. 3 performs the distribution process in step 131 shown in FIG. 15 in accordance with the flowchart illustrated in FIG. 16. First, the CPU 32 sets "1" as initial value to a count value "bn" of a counter (not shown) in step 132.

Then, the CPU 32 receives first block layout data 109a shown in FIG. 17 in step 133 in FIG. 16 from which the CPU 32 proceeds to step 134. When data input has been completed, the CPU 32 terminates the distribution process and moves to step 89 in FIG. 15.

In step 134, the CPU 32 stores the received block layout data 109a in the sixth data file 46 in FIG. 4 as block layout data corresponding to the bn-th block pattern data based on the count value "bn."

In the individual pattern data 108 and 108a–108d shown in FIG. 17, the first one is the original pattern data 108, the second one is the copied original pattern data 108a, the third one is the copied original pattern data 108b, the fourth one is the copied original pattern data 108c, and the fifth one is the copied original pattern data 108d. Based on the previously set count value bn(1), therefore, the CPU 32 stores the block number "1" in the block number area 52 of the first original pattern data 108 in the block-to-be-used number area 62 in the block layout data 109a. The CPU 32 also stores the first block layout data 109a into the sixth data file 46 in FIG. 4 after that the CPU 32 proceeds to step 135 from step 134.

In step 135, the CPU 32 increments the count value "bn." In step 136, the CPU 32 compares the count value "bn" with the block number "n" computed in step 111 in FIG. 15. When the count value "bn" does not exceed the block number "n", the CPU 32 goes to step 133 to receive the next block layout data 109b.

When the count value "bn" is greater than the block number "n", on the other hand, the CPU 32 proceeds to step 132 where the count value "bn" is set to the initial value.

When the count value "bn" does not exceed the block number "n", the CPU 32 repeats the processes in steps 133 to 135 shown in FIG. 16. In repeating those processes, the CPU 32 sets the successively received block layout data as block layout data corresponding to the bn-th block pattern data based on the incremented count value "bn."

As a result, the values in the block number areas 52 of the original pattern data 108 and the copied pattern data 108a–108d are stored in order in the block-to-be-used number areas of the block layout data 109. When block numbers "1" to "5" are stored in the original pattern data 108 and the copied pattern data 108a–108d as shown in FIG. 17, for example, the CPU 32 stores the block number "1" of the first original pattern data 108 in the first block layout data 109a in the block layout data 109 first.

Likewise, the CPU 32 sequentially stores the block numbers "2" to "5" of the second to fifth copied pattern data 108a–108d in the second to fifth block layout data 109b–109e. Then, the block number "1" of the first original pattern data 108 is stored in the sixth block layout data 109f.

The CPU 32 generates block output data and exposure data based on the individual pattern data 104, 106, 108 and 108a–108d and the block layout data 105, 107 and 109 shown in FIGS. 12 and 17 that have been set in the above-described manner and stores the generated data in the data files 43 and 44 shown in FIG. 4. Based on the block output data in the third data file 43, the stencil mask 121 shown in FIG. 14 is prepared. The layout positions of the individual pattern data 108 and 108a–108d are the same as those in the second embodiment.

Formed in the block areas 122 on the stencil mask 121 are the block patterns of the original pattern data 108 and the copied pattern data 108a–108d associated with the block 103, the block pattern of the block pattern data 106 associated with the block 102 and the block pattern of the block pattern data 104 associated with the block 101 all shown in FIGS. 12 and 17.

Then, the stencil mask 121 is set in the exposure apparatus 10 shown in FIG. 1. The exposure apparatus 10 controls the first and second electromagnetic deflectors 17 and 18 based on the exposure data in the fourth data file 44 shown in FIG. 4. Based on the exposure data, the exposure apparatus 10 first selects the block area 122 on the stencil mask 121 on which the original pattern data 108 in FIG. 13 is mounted. The exposure apparatus 10 then transfers the block pattern of the selected block area 122 once, after that the exposure apparatus 10 selects the block area 122 on the stencil mask 121 on which the subsequent copied pattern data 108a is mounted. Therefore, the exposure apparatus 10 sequentially and cyclically selects a plurality of block areas 122 on which the original pattern data 108 and the copied pattern data 108a–108d are mounted and exposes their respective block patterns.

In this case, with regard to a plurality of block areas 122 associated with the block 103, even if the temperature of the stencil mask 121 rises due to the beam irradiation on a specific one of the block areas, the temperature of that specific block area is reduced while the other block areas are used. Therefore, the temperature of the stencil mask by beam irradiation rises less as compared with the case where the block areas are consecutively used as in the second embodiment. This improves the durability of the stencil mask 121.

In addition to the above-described embodiments, the invention may be embodied in the following forms.

In the second and third embodiments, the coordinates of the block areas 122 at equal distances from a perpendicular line extending from the beam source 16 to the wafer 19 may be set with respect to the block information 53 of the individual pattern data 108 and 108a–108d associated with the block 103. Accordingly, the block patterns of the individual pattern data 108 and 108a–108d are formed in the block areas 122 at equal distances from the perpendicular line. In this case, the deformation of the electron beam that has passed through the block areas 122 associated with the pattern data 108 and 108a–108d becomes uniform on a practically negligible. It is therefore possible to accurately form patterns of the same shape on the wafer 19.

In the second and third embodiments, block patterns of the same shape are placed on adjoining block areas 122 as shown in FIG. 14. Instead, if the individual blocks 101–103 have basic layout patterns with different shapes and different transfer numbers, the stencil mask 121 may be prepared by distributing a plurality of blocks having patterns of the same shape so that they are not adjacent to one another. This will suppress the adverse affect of the scattering of the beam as compared with the case where a plurality of adjoining block areas are used consecutively.

In the third embodiment, exposure data is prepared so that the block area 122 is selected and exposed for every shot. Instead, exposure data may be prepared in a manner such that the block area 122 is selected and exposed for every plurality of shots.

In this case, the CPU 32 in FIG. 3 stores the same block number in a plurality of block-to-be-used number areas 62 in FIG. 17 based on the count value "bn" and in accordance with the bn-th block pattern data in step 134 in FIG. 16. In exposing the wafer 19 based on exposure data prepared in this manner, the exposure apparatus 10 in FIG. 1 does not change the block area 122 while exposing a plurality of portions. The modification therefore facilitates control of the first electromagnetic deflector 17.

Instead of using the transfer limit number as the copy condition in the determining processes in step 81 in the second and third embodiments, another copy condition like the area of the light passing hole may be used as well. Further, the transfer limit number may be combined with another condition.

Although a copy condition is entered by operating the keyboard 36 in the above-described embodiments, a file for copy conditions may previously be stored on a magnetic disk so that the desirable copy condition can be read from the magnetic disk.

Although the fifth data file 45 for storing the block pattern data 51 and the sixth data file 46 for storing the block layout data 61 are provided on the memory 33 in the above-described embodiments, the data files 45 and 46 may be provided on the magnetic disk 34.

In the above-described embodiments, the order of the exposure data generating process illustrated in FIG. 4 and the mounting block determining process illustrated in FIG. 5, 11 or 15 may be changed as needed. In the determining process in step 76 in FIG. 4, for example, a mounting block may be determined and copied, and the block layout data 61 may be stored as block output data in the third data file 43 every time the block layout data 61 is distributed.

The foregoing description has been given for the case where the layout pattern of an LSI is exposed on the wafer 19 as an exposure medium. The exposure medium is however in no way limited to a wafer, but a pattern may be exposed on a panel like an LCD (Liquid Crystal Display) or PDP (Plasma Display Panel).

Any type of a storage medium can be used to store the program in the above-described embodiments so long as it can record computer software. Specifically, such storage media include a semiconductor memory, floppy disk (FD), hard disk (HD), optical disk (CD-ROM), magneto-optical disk (MO, MD), phase change disk (PD) and magnetic tape.

Therefore, the present examples and embodiments are to be considered as illustrative and not restrictive and the invention is not to be limited to the details given herein, but may be modified within the scope of the appended claims.

What is claimed is:

1. A method of preparing exposure data necessary for transferring predetermined pattern information from a block on a mask to an exposure medium using a beam, the mask carrying a plurality of the blocks, each having said predetermined pattern information, said beam being deflected before and after it has passed through each block, said method comprising the steps of:

extracting common portions constituting a basic pattern from said pattern information to generate basic pattern information corresponding to said basic pattern, and generating plural pieces of layout data indicating coordinates of said basic pattern on said exposure medium;

copying said basic pattern information in accordance with a predetermined condition to generate plural pieces of copy pattern information, the sum of the original basic pattern information and the copy pattern information being collectively referred to as pieces of sum pattern information;

setting said pieces of sum pattern information respectively as blocks to be mounted;

distributing said plural pieces of layout data respectively to said pieces of sum pattern information;

selecting one block from said plurality of blocks and generating primary deflection data for deflecting said beam based on said basic pattern information and said layout data in order to irradiate said beam on said selected block; and generating secondary deflection data for further deflecting said beam, after it has passed through said selected block, based on said basic pattern information and said layout data in order to irradiate said beam on said exposure medium.

2. The method according to claim 1, wherein said layout data has a plurality of block number areas provided for coordinates of said basic pattern, and wherein said plurality of blocks are respectively assigned to said block number areas to thereby distribute said layout data.

3. The method according to claim 2, wherein said plurality of blocks have block numbers that are cyclically assigned to said plurality of block number areas, thereby allowing said coordinates of said basic pattern to be distributed to said plurality of blocks.

4. The method according to claim 2, wherein said plurality of blocks have block numbers that are respectively assigned to pieces of pattern information to be included in each block, thereby allowing said coordinates of said basic pattern to be distributed to said plurality of blocks.

5. The method according to claim 1, wherein said beam has an optical path center extending perpendicular to said exposure medium from said beam, and wherein said method further comprises the step of preparing data for arranging said plurality of blocks in a spiral form around said optical path center.

6. The method according to claim 1, wherein said beam has an optical path center extending perpendicular to said exposure medium from said beam, and wherein said method further comprises the step of preparing data for arranging said plurality of blocks at equal distances from one another with respect to said optical path center.

7. A method of preparing mask data necessary for transferring predetermined pattern information on an exposure medium by irradiating a beam emitted from a light source on said exposure medium through a mask carrying a plurality of blocks each having said predetermined pattern information, said method comprising the steps of:

extracting common portions constituting a basic pattern from said pattern information to generate basic pattern information corresponding to said basic pattern, and generating plural pieces of layout data indicating coordinates of said basic pattern on said exposure medium;

copying said basic pattern information in accordance with a predetermined condition to generate plural pieces of copy pattern information, the sum of the original basic pattern information and the copy pattern information being called sum pattern information;

setting said pieces of sum pattern information respectively as blocks to be mounted; and distributing said plural pieces of layout data to said sum pattern information.

8. A recording medium having recorded a program for preparing exposure data necessary for transferring predetermined pattern information on an exposure medium by irradiating a beam emitted from a light source and having a predetermined cross-sectional shape on a mask carrying a plurality of blocks having said predetermined pattern information while deflecting said beam and irradiating said beam, after it has passed through each block, on said exposure medium while further deflecting said beam, said program comprising the steps of:

extracting common portions constituting a basic pattern from said pattern information to generate basic pattern information corresponding to said basic pattern, and generating plural pieces of layout data indicating coordinates of said basic pattern on said exposure medium;

copying said basic pattern information in accordance with a predetermined condition to generate plural pieces of copy pattern information, the sum of the original basic pattern information and the copy pattern information being called sum pattern information;

setting said pieces of sum pattern information respectively as blocks to be mounted;

distributing said plural pieces of layout data to said sum pattern information;

selecting one block from said plurality of blocks and generating primary deflection data for deflecting said beam of said predetermined cross-sectional shape based on said basic pattern information and said layout data in order to irradiate said beam on said selected block; and generating secondary deflection data for further deflecting said beam that has passed said selected block based on said basic pattern information and said layout data in order to irradiate said beam on said exposure medium.

9. A recording medium having recorded a program for preparing mask data necessary for transferring predetermined pattern information on an exposure medium by irradiating a beam emitted from a light source on said exposure medium through a mask carrying a plurality of blocks having said predetermined pattern information, said program comprising the steps of:

extracting common portions constituting a basic pattern from said pattern information to generate basic pattern information corresponding to said basic pattern, and generating plural pieces of layout data indicating coordinates of said basic pattern on said exposure medium;

copying said basic pattern information in accordance with a predetermined condition to generate plural pieces of copy pattern information, the sum of the original basic pattern information and the copy pattern information being called sum pattern information;

setting said pieces of sum pattern information respectively as blocks to be mounted; and distributing said plural pieces of layout data to said sum pattern information.

* * * * *